United States Patent
Syed

(10) Patent No.: US 7,203,875 B2
(45) Date of Patent: Apr. 10, 2007

(54) TEST SYSTEMS AND METHODS WITH COMPENSATION TECHNIQUES

(75) Inventor: Ahmed Rashid Syed, Santa Clara, CA (US)

(73) Assignee: Credence Systems Corporation, Milpitas, CA (US)

( * ) Notice: Subject to any disclaimer, the term of this patent is extended or adjusted under 35 U.S.C. 154(b) by 303 days.

(21) Appl. No.: 10/841,019

(22) Filed: May 7, 2004

(65) Prior Publication Data

US 2005/0022081 A1    Jan. 27, 2005

Related U.S. Application Data

(60) Provisional application No. 60/506,986, filed on Sep. 29, 2003, provisional application No. 60/505,912, filed on Sep. 25, 2003, provisional application No. 60/468,438, filed on May 7, 2003.

(51) Int. Cl.
*G01R 31/317* (2006.01)
*G01R 31/333* (2006.01)

(52) U.S. Cl. .................. 714/724; 714/700; 714/55
(58) Field of Classification Search ............. 714/724, 714/744, 731, 700, 55
See application file for complete search history.

(56) References Cited

U.S. PATENT DOCUMENTS 6,268,753 B1 *   7/2001   Sandusky ............. 327/266

6,522,162 B2   2/2003   Griffin et al.

OTHER PUBLICATIONS

Toshiyuki Okayasu et al., "CMOS Circuit Technology for Precise GHz Timing Generator," *IEEE: ITC International Test Conference*, Paper 31.2, pp. 894-902 (2002).
Mark R. Barber, "Fundamental Timing Problems in Testing MOS VLSI on Modern ATE," *IEEE Design & Test*, pp. 90-97 (Aug. 1984).
James A. Gasbarro et al., "Integrated Pin Electronics for VLSI Functional Testers," *IEEE Journal of Solid-State Circuits*, vol. 24(2), pp. 331-337 (Apr. 1989).
James A. Gasbarro et al., "A Single-Chip, Functional Tester for VLSI Circuits," *IEEE International Solid State Circuits Conference*, pp. 84-86 (Feb. 1990).
A.T. Sivaram, "Split Timing Mode (STM)—Answer to Dual Frequency Domain Testing," *IEEE ITC International Test Conference*, Paper 6.1, pp. 140-147 (2001).
Robert Hägglund et al., "Tuning and Compensation of Temperature Effects in Analog Integrated Filters," Department of Electrical Engineering, Linköping University, no date.

* cited by examiner

*Primary Examiner*—Albert Decady
*Assistant Examiner*—Dipakkumar Gandhi

(57) ABSTRACT

The present invention relates to test systems for testing integrated circuit devices and to calibration associated systems and methods. One embodiment of the invention provides a method for providing formatted levels for use in a test system. The method includes: providing on a single CMOS IC, a timing generation circuit operative to provide timing information signals; and a formatter in communication with the timing generation circuit.

14 Claims, 25 Drawing Sheets

FIG. 4 (DRIVE CIRCUIT)

GENERATION OF FORMATTED LEVELS PER PIN

Data Flow Timing Diagram

GENERATION OF STROBE MARKERS AND FAILS PER PIN

RECEIVE/STROBE CIRCUIT (X8 PER IC)

RECEIVE/STROBE CIRCUIT (X8 PER IC)

RECEIVE/STROBE CIRCUIT (X8 PER IC)

RECEIVE/STROBE CIRCUIT (X8 PER IC)

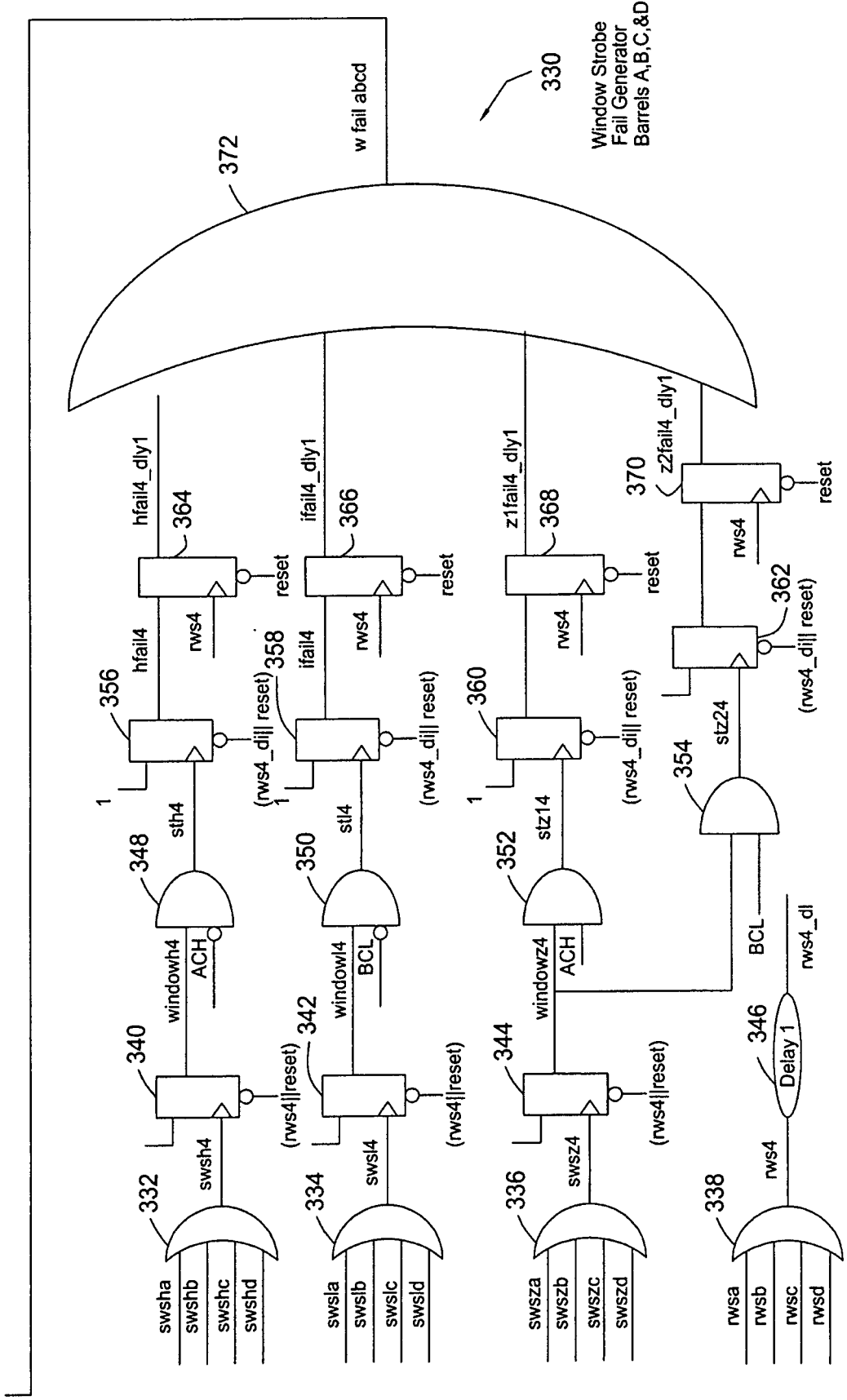
FIG. 12E RECEIVE/STROBE CIRCUIT (X8 PER IC)

RECEIVE/STROBE CIRCUIT (X8 PER IC)

ELIF (Pg. 1)

ELIF (Pg. 2)

TEST SYSTEMS AND METHODS WITH COMPENSATION TECHNIQUES

RELATED APPLICATIONS

This application claims priority to and the benefit of: earlier filed U.S. Provisional Application Ser. No. 60/468,438, filed May 7, 2003, entitled "Multi-Channel CMOS formatter;" earlier filed U.S. Provisional Application Ser. No. 60/505,912, filed Sep. 25, 2003, entitled "Test Systems and Methods;" and earlier filed U.S. Provisional Application Ser. No. 60/506,986, filed Sep. 29, 2003, entitled "Test Systems and Methods;"

BACKGROUND OF THE INVENTION

The present invention relates to test systems and methods for testing integrated circuit devices.

To test high-speed devices, conventional test systems generate multiple high-frequency timing signals in order to format signals for each of the device-under-test (DUT) pins being tested. Each timing signal typically appears as a low-to-high voltage transition (a "rising edge"). The circuitry used to generate these timing signals generally may be divided into two portions: a first portion, called the "timing marker generation circuit" or an "edge generator circuit;" and a second portion, called the "formatter." The timing marker generation circuit converts data received from a computer processing unit (CPU) to a software word, the software word including information about the time for a timing signal transition (i.e., the "timing marker" or "timing edge"). The formatter applies an edge type (e.g., the rising edge) to inputs of a pin electronics device at a time determined using information contained in the software word.

In a typical test system, the timing generation circuit converts data received from the CPU to software words for transmission to a formatter. The software words indicate a desired output level and the desired timing of the output level. In conventional test systems, the formatter generally is a dedicated resource per DUT pin and drives or strobes the input of a pin electronics (PE) device that is coupled to a DUT pin at a fixed frequency, usually the test system frequency. One can describe a PE device as including electronic buffers and comparators that communicate back and forth with a DUT. The formatter generally includes two complementary formatting circuits—a drive circuit for generating test signals to be applied to inputs of the PE device and a response circuit for receiving the signals from outputs of the PE device coupled to the DUT.

The drive circuit outputs accurate timing edges or formatted signals. The drive circuit outputs certain signals, which may include two formatted signals, such as drive-high (DHI) and drive-inhibit (DINH). For example, a typical drive circuit can output formatted signals DHI and DINH to the PE device. The PE device uses formatted signals DHI and DINH, or similar markers, to determine whether to drive a DUT pin to a predefined logic state, such as high, low, or tri-state.

The response circuit generates timing markers, such as StbHi, StbLo, StbOff, and StbZ, which are used with event type information to strobe signals coming from the PE, such as above comparator high (ACH) and below comparator low (BCL), to determine whether the DUT pin passes or fails a test. If the event type indicates a state different than the actual state of signals ACH and BCL, the response circuit generates and transmits a "fail" signal. The test system then records the data generated by the response circuit, creates a data log and transfers the data to the CPU or to local memory for analysis.

Test systems for testing high-speed integrated-circuit devices, such as microprocessors and microcontrollers, have become increasingly sophisticated due to high-speed requirements. Formatters play a crucial role in establishing the accuracy, and indeed, the functionality of a test system. Evolving system architectures, testing paradigms, and DUT specifications pose new challenges and requirements on the design of timing critical circuitry. Notable among these requirements is the requirement that current and future test systems hardware bring down the total cost of test through better hardware integration and software support. Modem test systems hardware needs to be both modular and flexible.

GaAs or Bipolar technologies are well known to be suited for high-speed (e.g. around 800 Mbps) and high accuracy (less than +/−100 ps edge placement accuracy) timing applications. However the use of GaAs or Bipolar technologies results in a relative increase in hardware costs. Furthermore, the use of these technologies results in a relative increase in system size and power consumption.

On the other hand, CMOS technologies are well known to be suited for low cost, small size and low power applications that do not require highly accurate edge placement (e.g., less than +/−100 ps). Temperature and voltage variation are factors in reduction of edge placement accuracy (EPA) in CMOS. In other words, temperature and voltage variation are examples of timing error factors in CMOS.

As an example of an article addressing the impact of temperature variation on CMOS technology, R. Hägglund and L. Wanhammar, in "Tuning and compensation of Temperature Effects in Analog Integrated Filters," (listed as being published in *Proc. Swedish System-on-Chip Conf.*, Arild, Sweden, May 20–21, 2001 and incorporated herein by reference in its entirety) discuss tuning strategies for integrated filters and compensation schemes to decrease the temperature dependence of the transconductance value of a differential gain stage. The Hagglund article notes that an increase in temperature causes CMOS transistors to conduct a larger current. Thus, given temperature variations of a specified size, neither the transconductance value nor the drain-source resistance have a constant value and therefore the gain, bandwidth and phase response vary with the temperature, affecting the transfer function.

As another example of an article that discusses attempts to solve timing error factors in CMOS technology, Okayasu, M. Suda, and K. Yamamoto, in "CMOS Circuit Technology for Precise GHz Timing Generator" (listed as being presented on Oct. 9, 2002 at the 2002ITC International Test Conference in Baltimore Md., and incorporated herein by reference in its entirety) discuss CMOS circuit technology for a GHz timing-generator.

Given that bipolar technologies typically result in relatively large system size and power consumption and given that CMOS technology typically does not result in relatively accurate edge placement (e.g., less than +/−100 ps), a need exists for test systems that are suitable for high-speed and high accuracy timing applications and that are low cost and have small size and low power consumption relative to conventional systems.

SUMMARY OF THE INVENTION

The present invention relates to test systems for testing integrated circuit devices. One embodiment of the invention provides a portion of a test system including: on a single CMOS IC, a timing generation circuit; and a formatter in communication with the timing generation circuit. The timing generation circuit generates timing information signals. The formatter receives the timing information signals and provides a specified number of transitions per second and a specified edge placement resolution and accuracy. The formatter includes: a drive circuit and a response circuit. The drive circuit includes a plurality of slices. Each slice receives an independent data stream and produces an independent formatted level. The response circuit includes a plurality of slices. Each slice receives an independent data stream and produces an independent strobe marker.

In certain embodiments, the specified transitions per second is between about 400 MTPS and about 1600 MTPS, the specified resolution is between about 10 ps and about 30 ps, and the specified accuracy is between about 60 ps and about 100 ps.

Another embodiment of the invention provides a portion of a test system including: on a single CMOS IC, a timing generation circuit; and a formatter in communication with the timing generation circuit. The timing generation circuit generates timing information signals. The formatter receives the timing information signals and provides a specified number of transitions per second and a specified edge placement resolution and accuracy.

In one embodiment, the formatter includes a drive circuit. The drive circuit can include a plurality of slices. Each slice receives an independent data stream and produces a formatted level. In one embodiment, each slice includes: a plurality of event logic interfaces, each event logic interface capable of decoding signals received from the timing generation circuit; a plurality of DLEs, each DLE being coupled to a corresponding event logic interface and being capable of generating timing markers corresponding to signals received from an event logic interface; and drive logic coupled to the plurality of DLEs and operative to produce formatted levels in response to timing markers received from the DLEs. In certain embodiments, the number of slices is 8, the number of event logic interfaces is 4 and the number of DLEs is 4.

In one embodiment, the formatter includes a response circuit, the response circuit includes a plurality of slices. Each slice receives an independent data stream and produces a strobe marker. In one embodiment, each slice includes: a plurality of event logic interfaces, each event logic interface capable of decoding signals received from the timing generation circuit; a plurality of DLEs, each DLE being coupled to a corresponding event logic interface and being capable of generating timing markers corresponding to signals received from an event logic interface; and response logic coupled to the plurality of DLEs and operative to produce strobe markers in response to timing markers received from the DLEs.

Yet another embodiment of the invention provides a method for testing a DUT. The method includes providing a formatter operative to supply a specified number of transitions per second and a specified edge placement resolution and accuracy. The formatter includes: a drive circuit, the drive circuit including a plurality of slices, each slice operative to receive an independent data stream and to produce a formatted level. The method further includes independently controlling each slice to independently test a plurality of DUT pins. In one embodiment, providing the formatter includes: providing, on a single CMOS IC, a timing generation circuit and a formatter, the formatter being coupled to the timing generation circuit.

Still another embodiment of the invention includes a method for providing formatted levels for use in a test system. The method includes: providing on a single CMOS IC, a timing generation circuit operative to provide timing information signals; and a formatter in communication with the timing generation circuit. The formatter includes: a drive circuit. The drive circuit includes: a plurality of event logic interfaces, each event logic interface capable of decoding signals received from the timing generation circuit; a plurality of delay line elements (DLEs), each DLE in communication with a corresponding event logic interface and being capable of generating timing markers corresponding to signals received from an event logic interface; and drive logic in communication with the plurality of DLEs and operative to produce formatted levels in response to timing markers received from the DLEs.

The method further includes: a) compensating for drain to source voltage variation for elements in the DLEs to maintain the drain to source voltage variation below a specified percentage such that the formatter provides a specified number of transitions per second and a specified edge placement resolution and accuracy; b) compensating for temperature variation for elements in the DLEs to maintain the temperature variation below a specified percentage such that the formatter provides a specified number of transitions per second and a specified edge placement resolution and accuracy; and/or c) compensating for voltage variation for elements in the drive logic to maintain the voltage variation below a specified percentage such that the formatter provides a specified number of transitions per second and a specified edge placement resolution and accuracy. Compensating for voltage variation can include using bandgap references to compensate for voltage variation.

DRAWING DESCRIPTIONS

Figure 10:
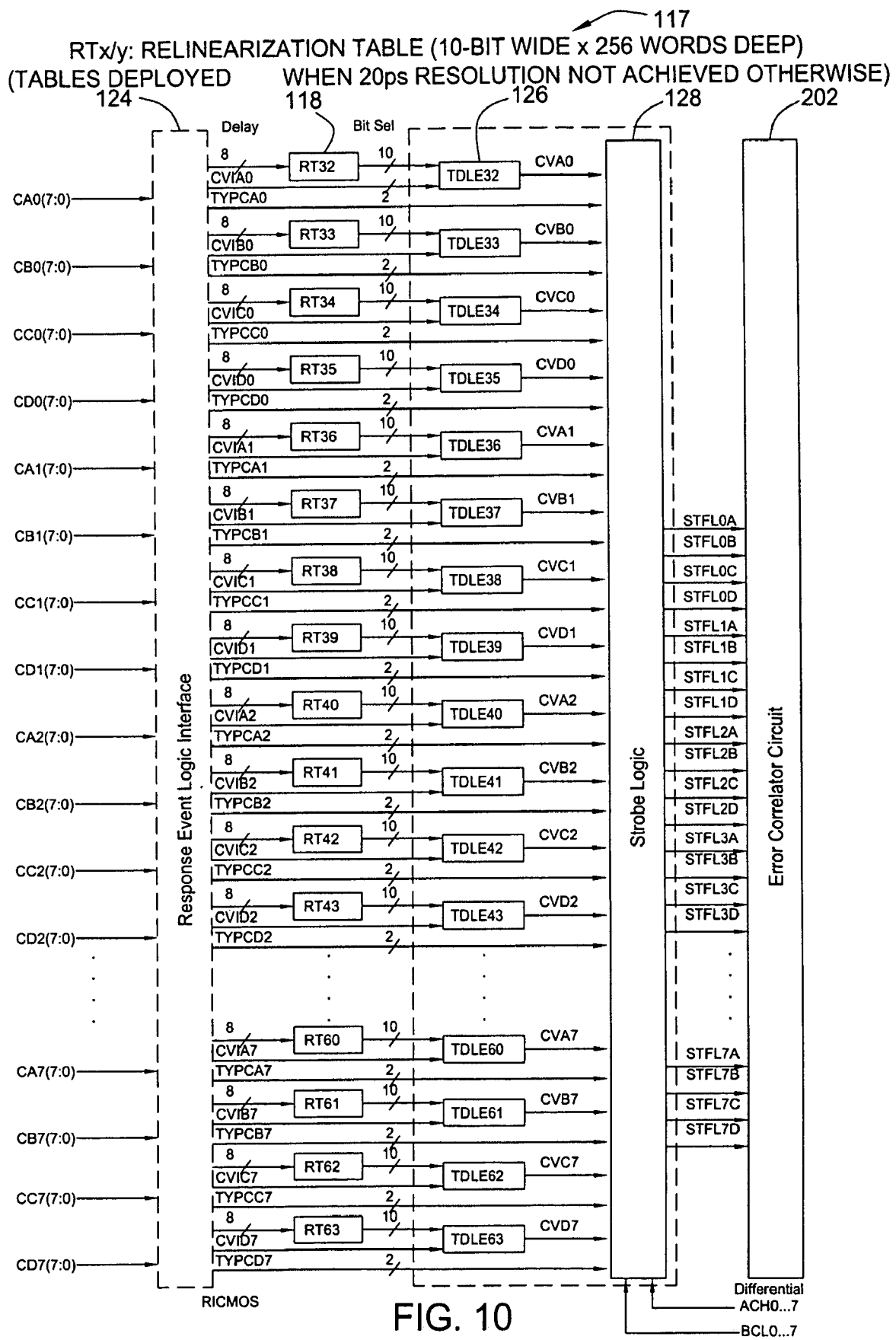
FIG. 10 is a diagram of a response circuit for the formatter of FIG. 1.

FIGS. 12A–F are diagrams of portions of the response circuit of FIG. 10.

Figure 13:
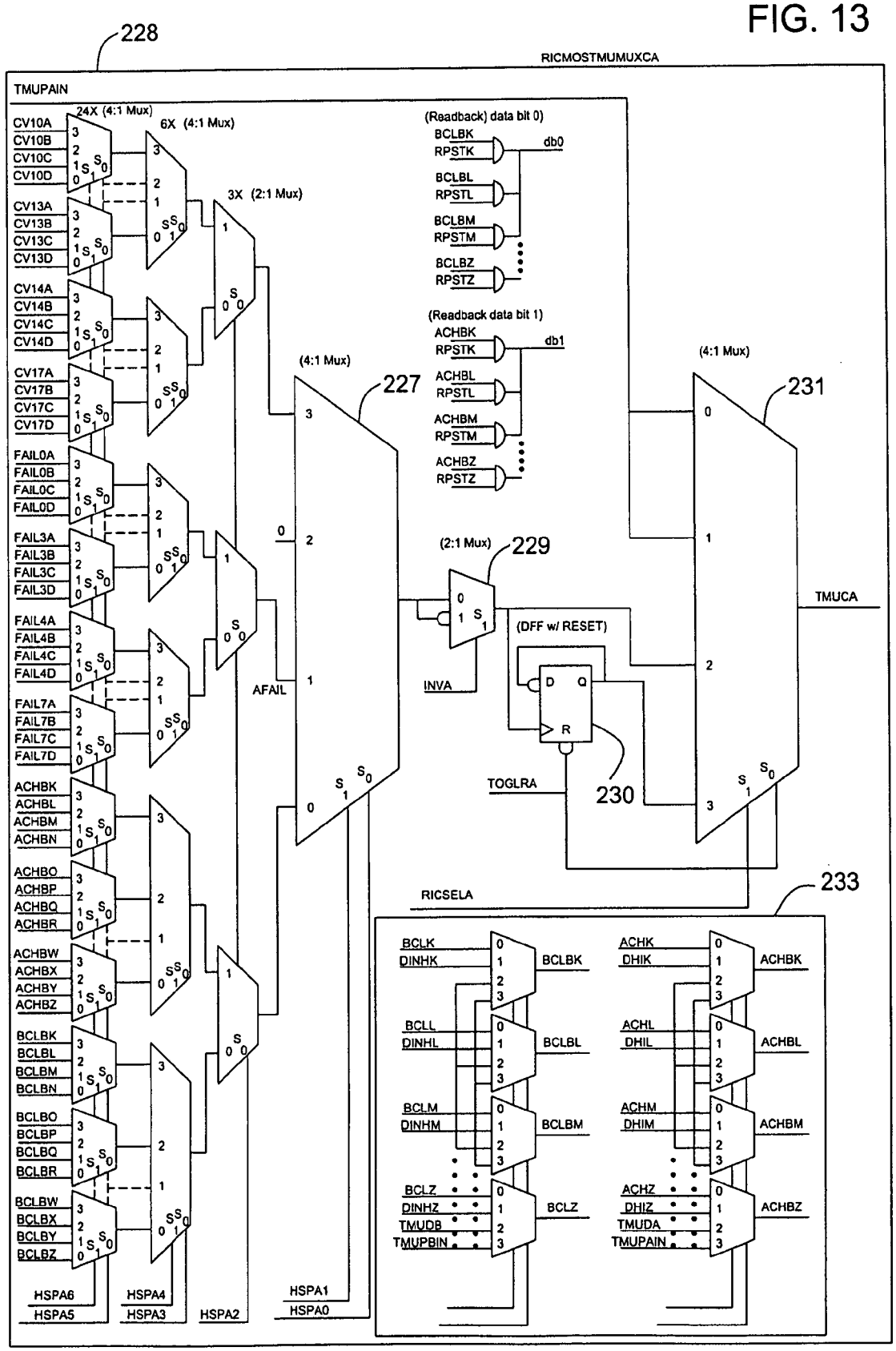

FIG. 13 is a diagram of a TMUMUX section coupled to the response circuit of FIG. 10.

Figure 14A:
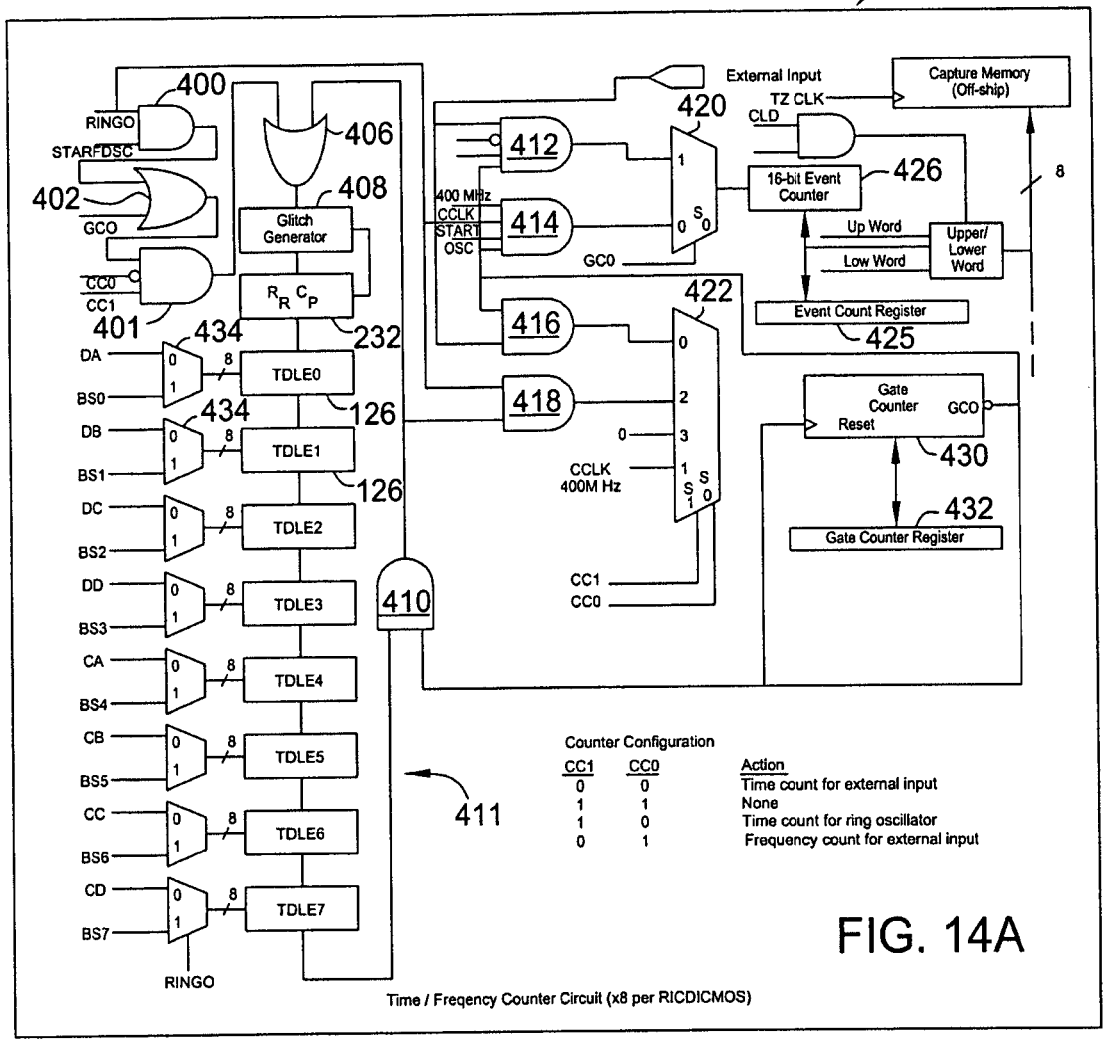
Figure 14B:
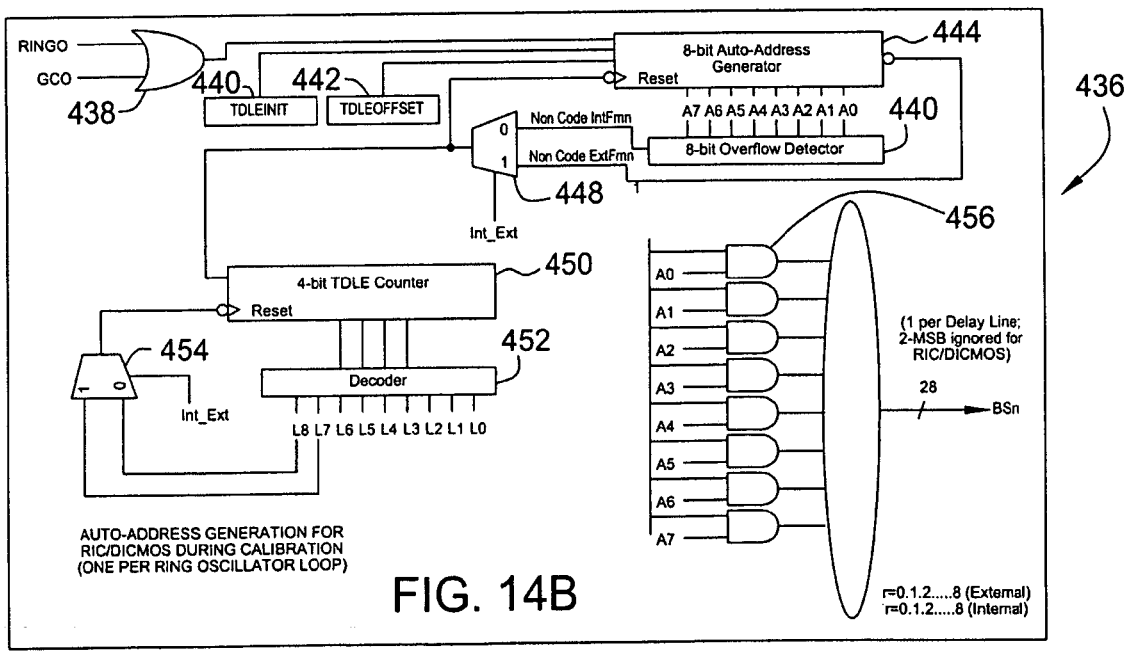
Figure 14C:
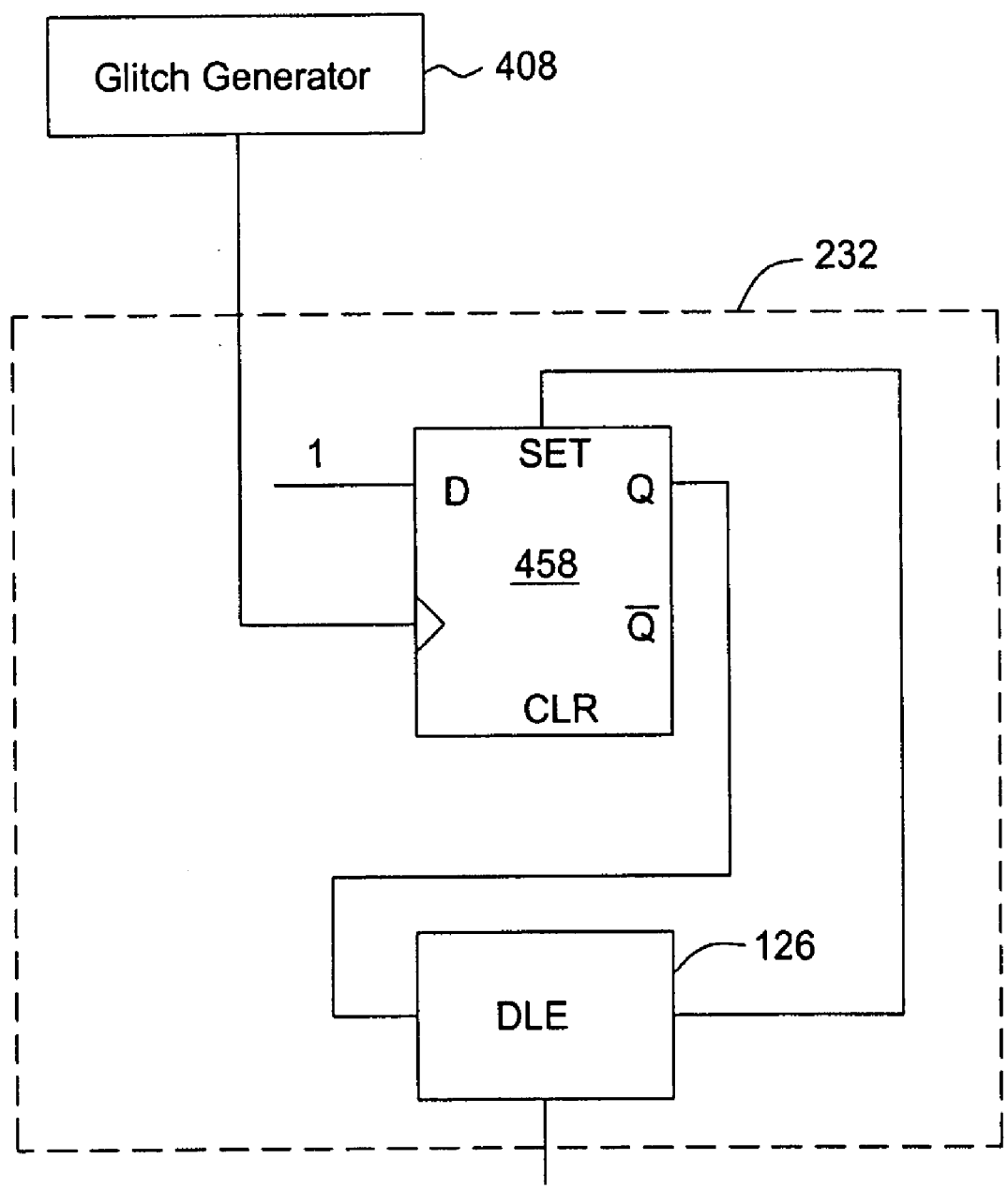

FIG. 14A–C are logical representations of the auto-calibration components of FIG. 13.

Figure 1:
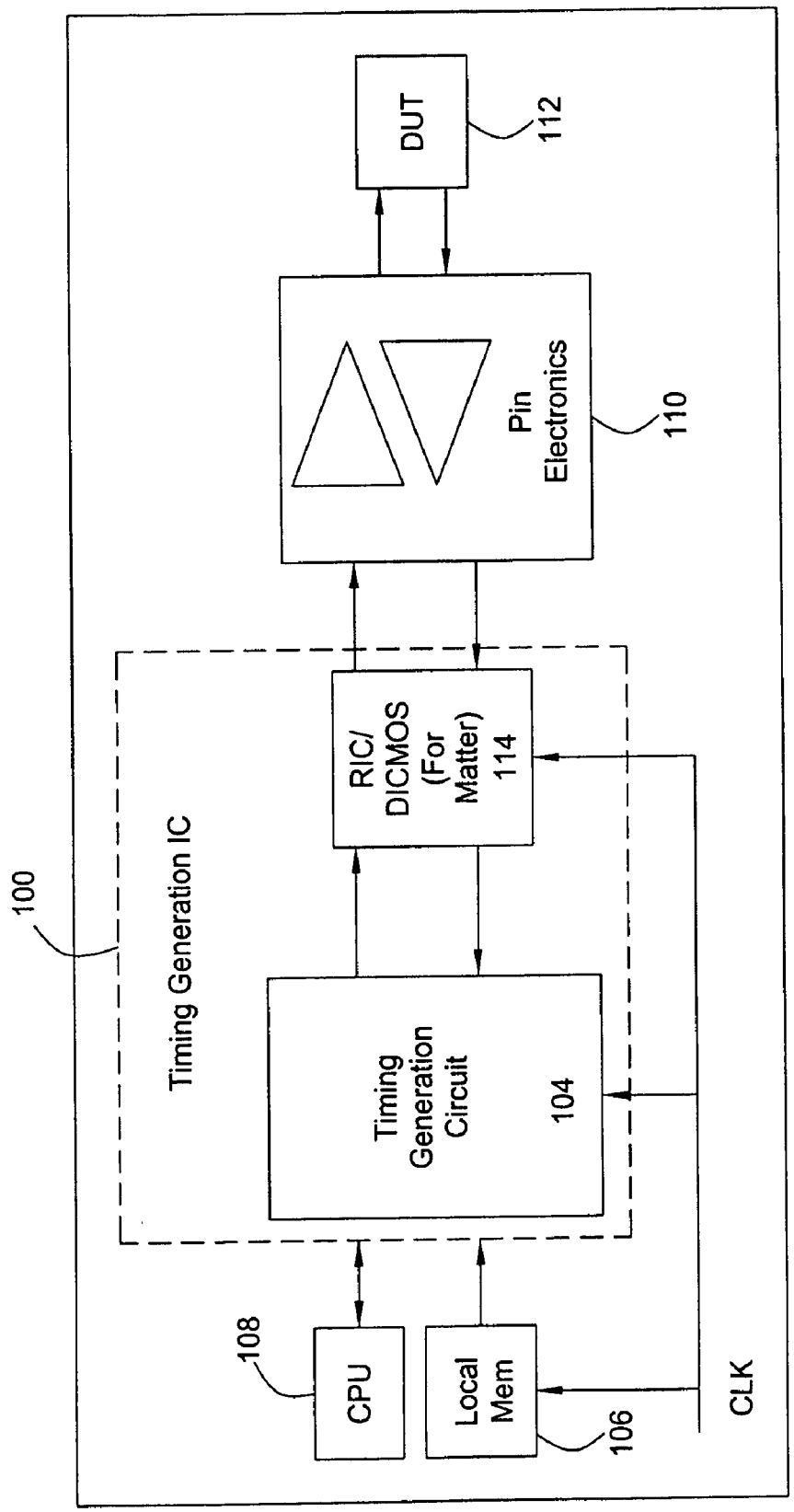
FIG. 1 is a block diagram of one embodiment of a test system for testing a device under test (DUT).
Figure 15A:
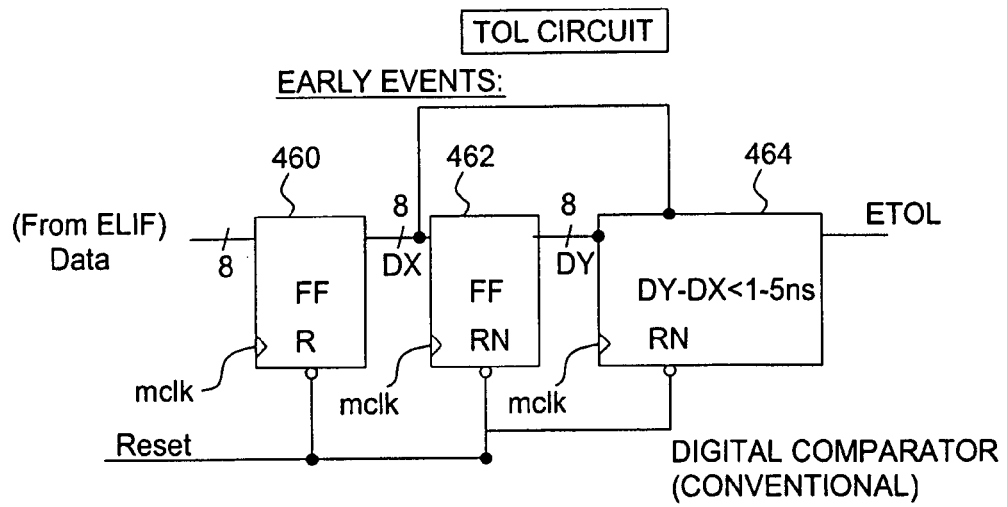
Figure 15B:
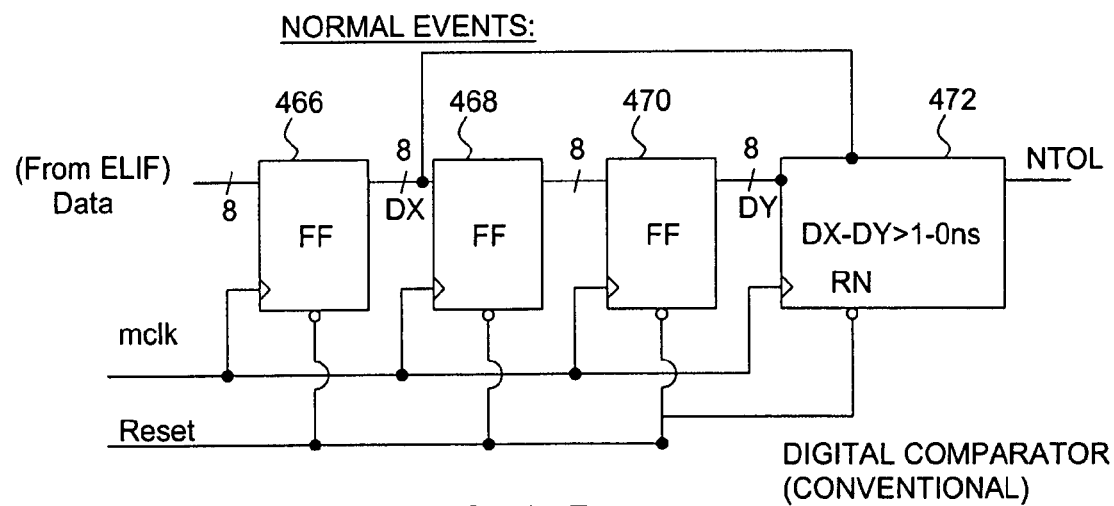

FIGS. 15A and 15B are diagrams of one embodiment of a timing overload (TOL) circuit of the formatter of FIG. 1.

Figure 16A:
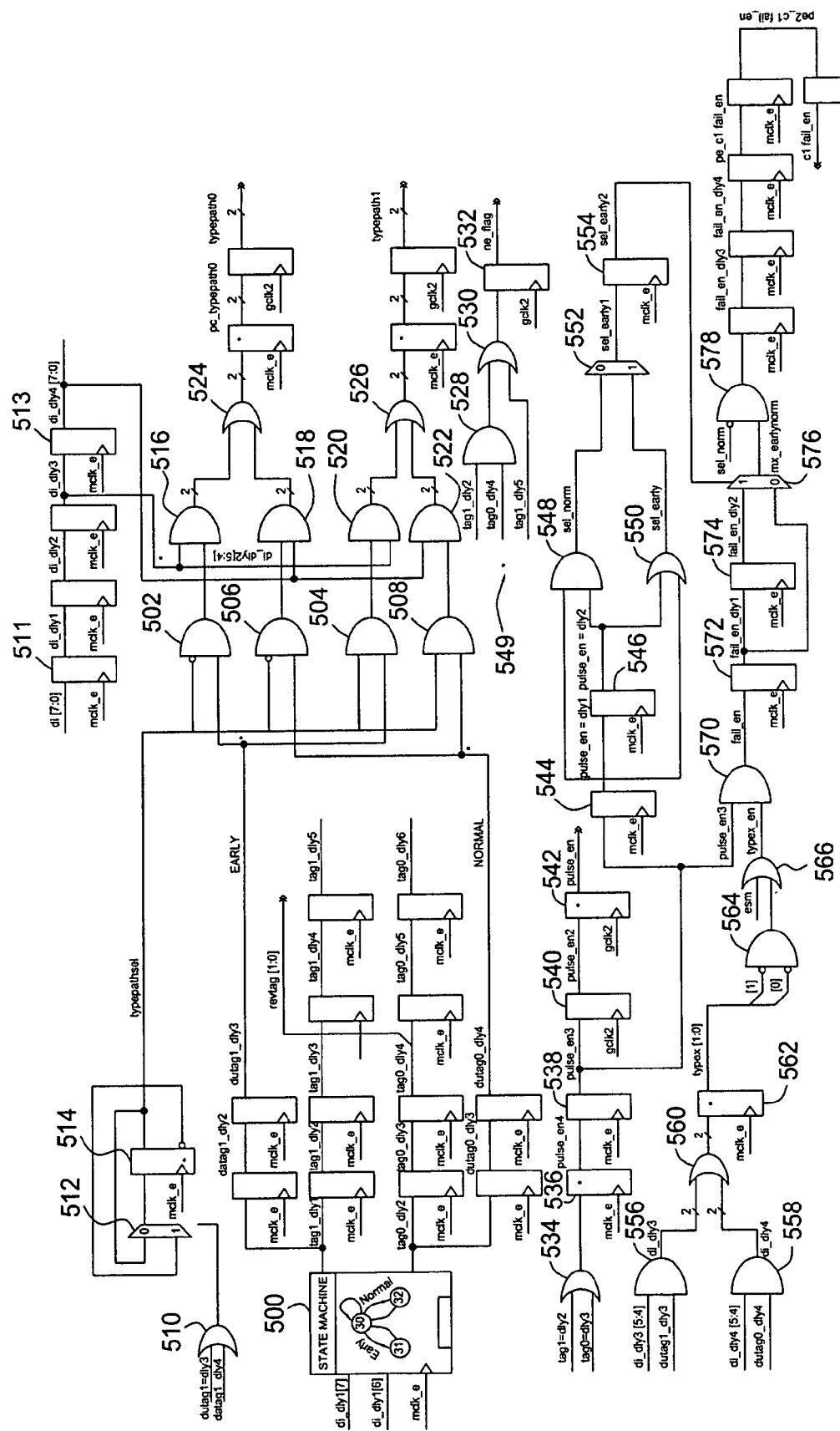
Figure 16B:
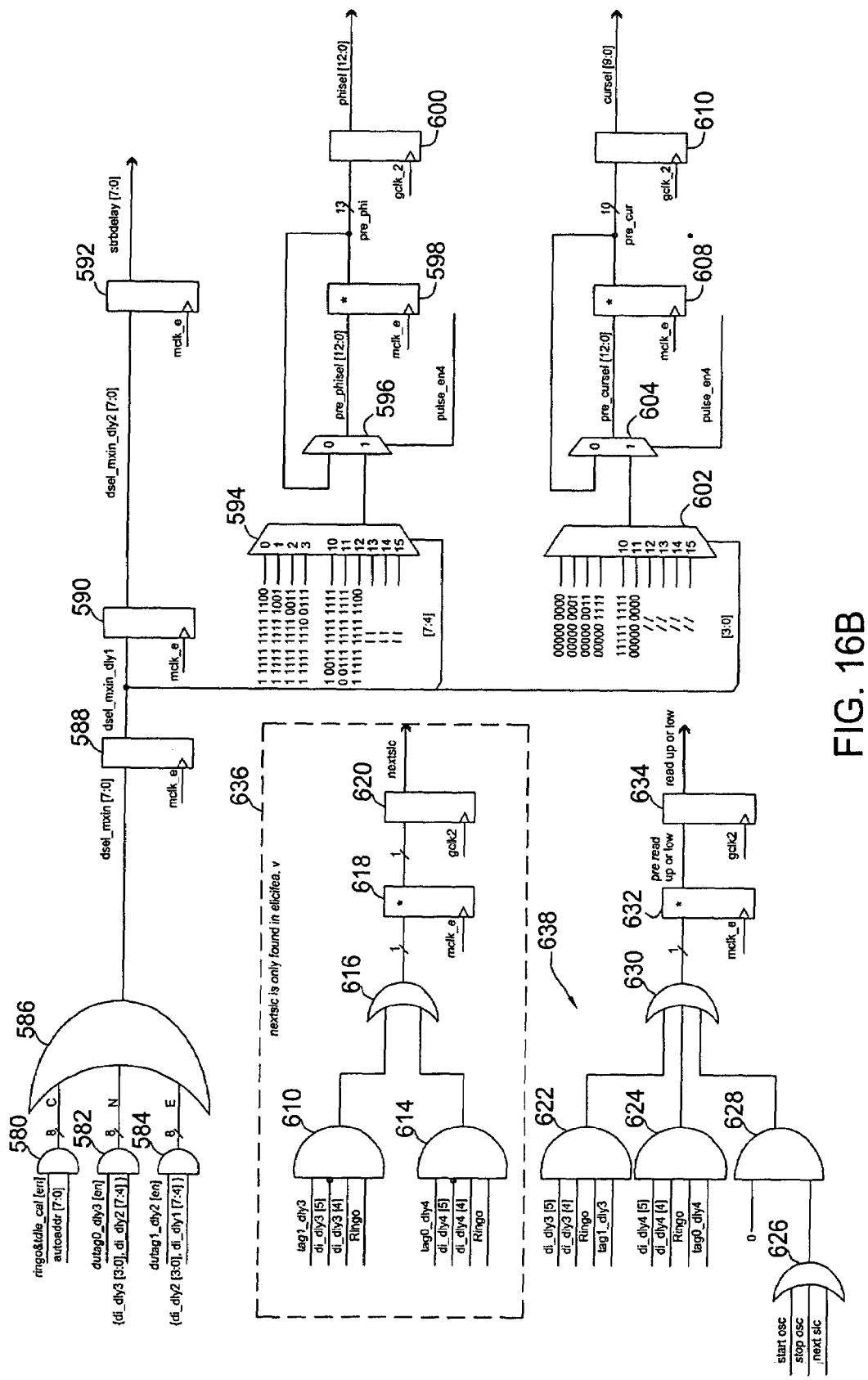

FIGS. 16A and 16B are diagrams of one embodiment of an event logic interface (ELIF) circuit of the formatter of FIG. 1.

FIGS. 17, A, 17B, and 17C illustrate SPICE simulations results obtained for the formatter of FIG. 1.

Figure 12A:
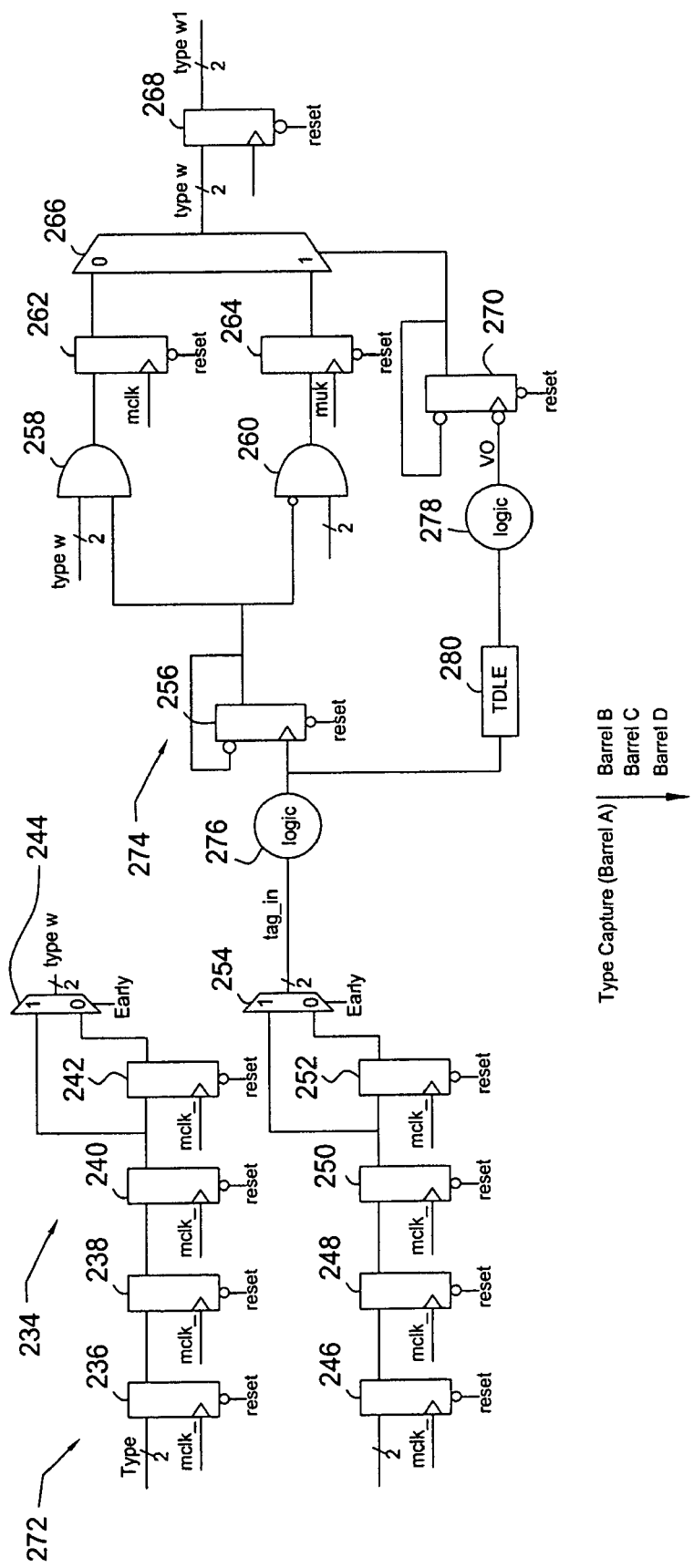
Figure 18:
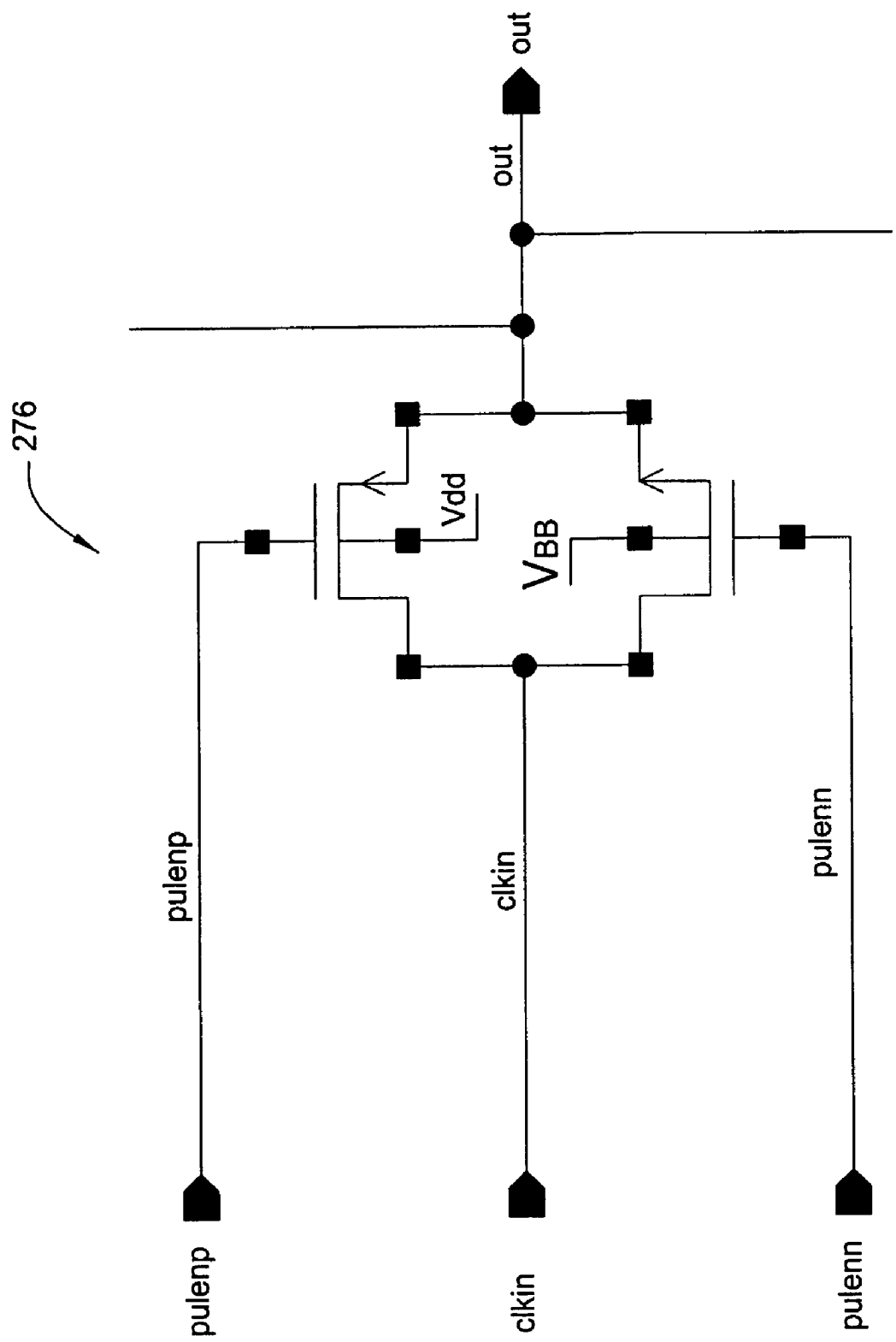

FIG. 18 is one embodiment of logic incorporated in one embodiment of the receive/strobe circuit of FIG. 12A.

Like reference symbols in the various drawings indicate like elements.

DETAILED DESCRIPTION OF THE INVENTION

The present invention relates to test systems for testing integrated circuit devices.

As used in this document, the term formatted levels can refer to timing edges, formatted signals or a combination of both. In other words, formatted levels can refer to timing edges and/or to transitions from one set of signal states to another set of signal states.

With reference to FIG. 1, according to one embodiment of the invention, a test system for testing a device-under-test (DUT) includes a computer processing unit 108 and a local memory 106 both in communication with a timing generation integrated circuit (IC) 100. The timing generation IC 100 includes a timing generation circuit 104 and a formatter 114. Although a test system designer can place the timing generation circuit 104 and the formatter 144 on different ICs, one embodiment has the timing generation circuit 104 and the formatter on a single CMOS IC. The timing generator circuit 104 receives data from the CPU and converts the data to software words and transmits the software words to a formatter 114. The software words indicate a desired signal level and the desired timing of the signal level. The formatter, in turn, provides formatted levels to a pin electronics (PE) device 110. One can describe a PE device as including electronic buffers and comparators that communicate back and forth with a DUT. Thus, the PE device 110 is coupled to a DUT 112. On the response or receive path, the formatter 114 analyzes or samples the output from the DUT via the PE device to assist in determining whether the output of the DUT is as expected.

Figure 2:
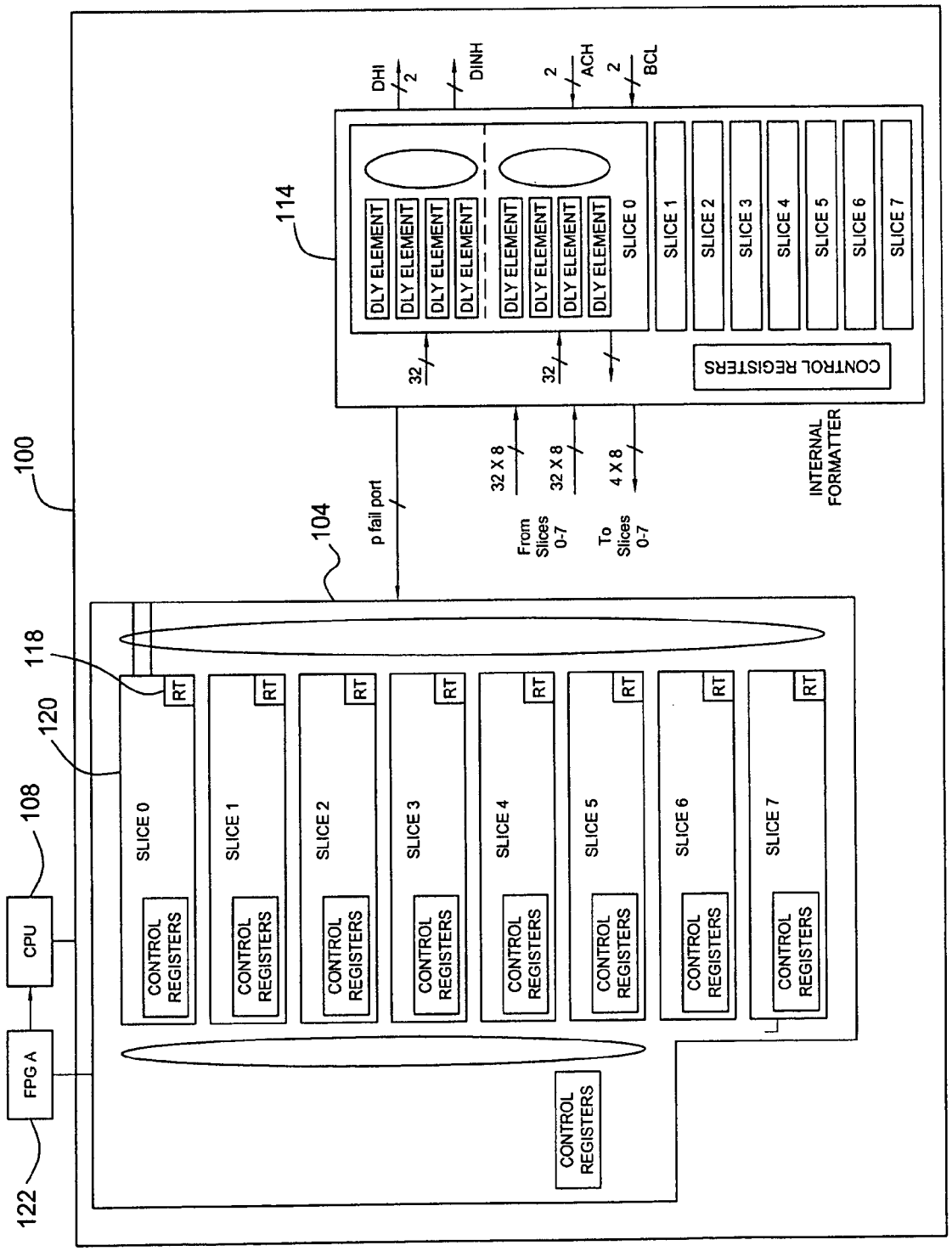
FIG. 2 is block diagram of one embodiment of the timing generation IC of FIG. 1.

With reference to FIG. 2, one embodiment of the timing generation IC 100 of FIG. 1 is coupled to a field programmable gate array (FPGA) 122, which in turn is coupled to a CPU 108. The FPGA 122 provides control setup information to the formatter 114. The timing generation circuit 104 and formatter 114 include a plurality of what can be referred to as time slices or "slices" 120. A slice is a set of independently controllable circuitry such that each slice facilitates independent testing of a DUT pin. In one embodiment, the timing generator and formatter include eight slices 120. As described further below, using embodiments of the invention, one can independently software program each slice to provide independent formatted levels and/or independent strobe markers to allow a formatter according to the invention to independently test a plurality of DUT pins. In other words, using embodiments of the invention one can test a first DUT pin independent of a second DUT pin using a test system that has both the formatter and the timing generator on a single IC. The formatter of FIG. 1 can include two complementary formatting circuits—a drive circuit for generating test signals to be applied to inputs of the PE device and a response circuit for receiving signals from outputs of the PE device coupled to the DUT.

The Drive Circuit

Figure 3:
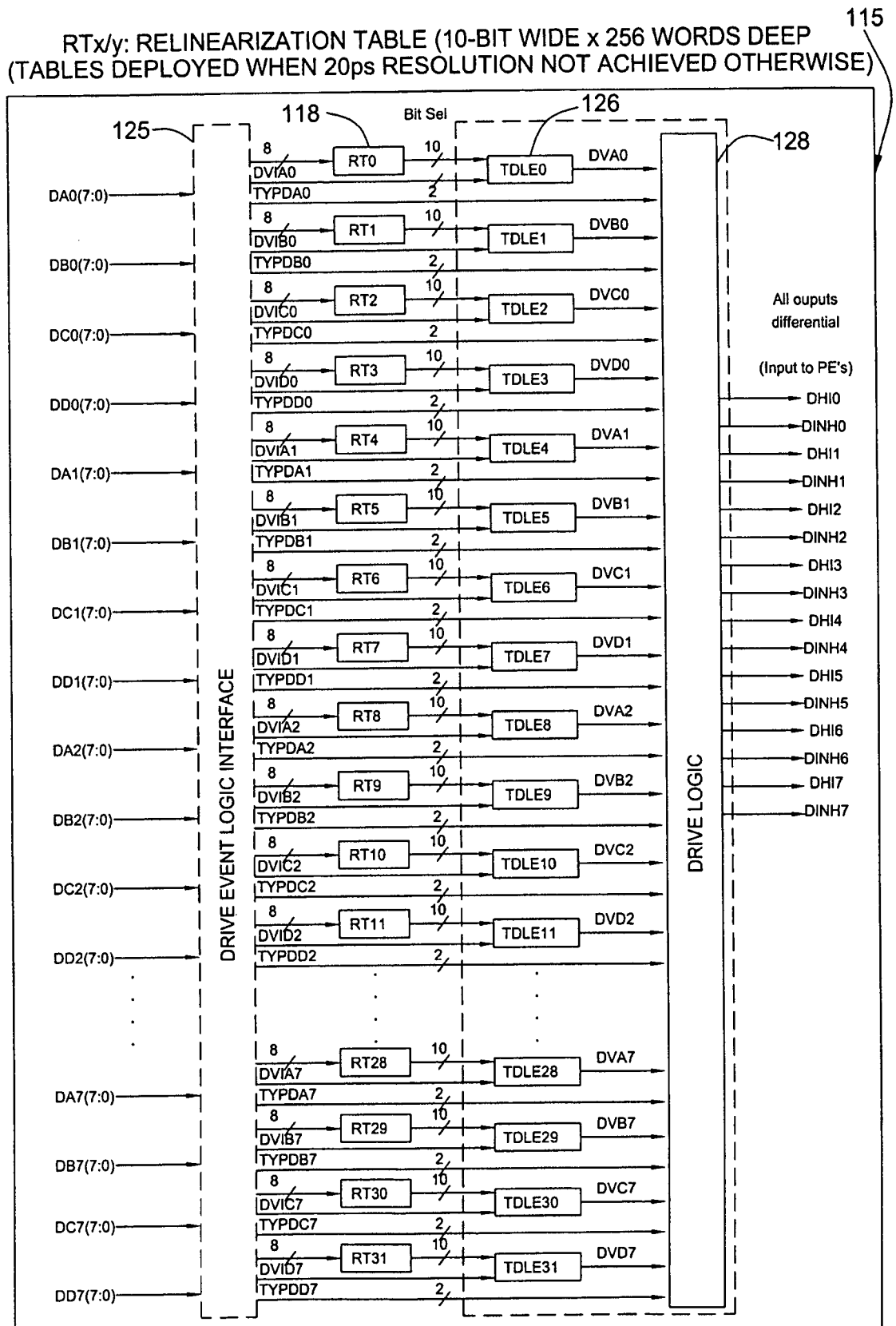
FIG. 3 is a diagram of a drive circuit for the formatter of FIG. 1.
Figure 4:
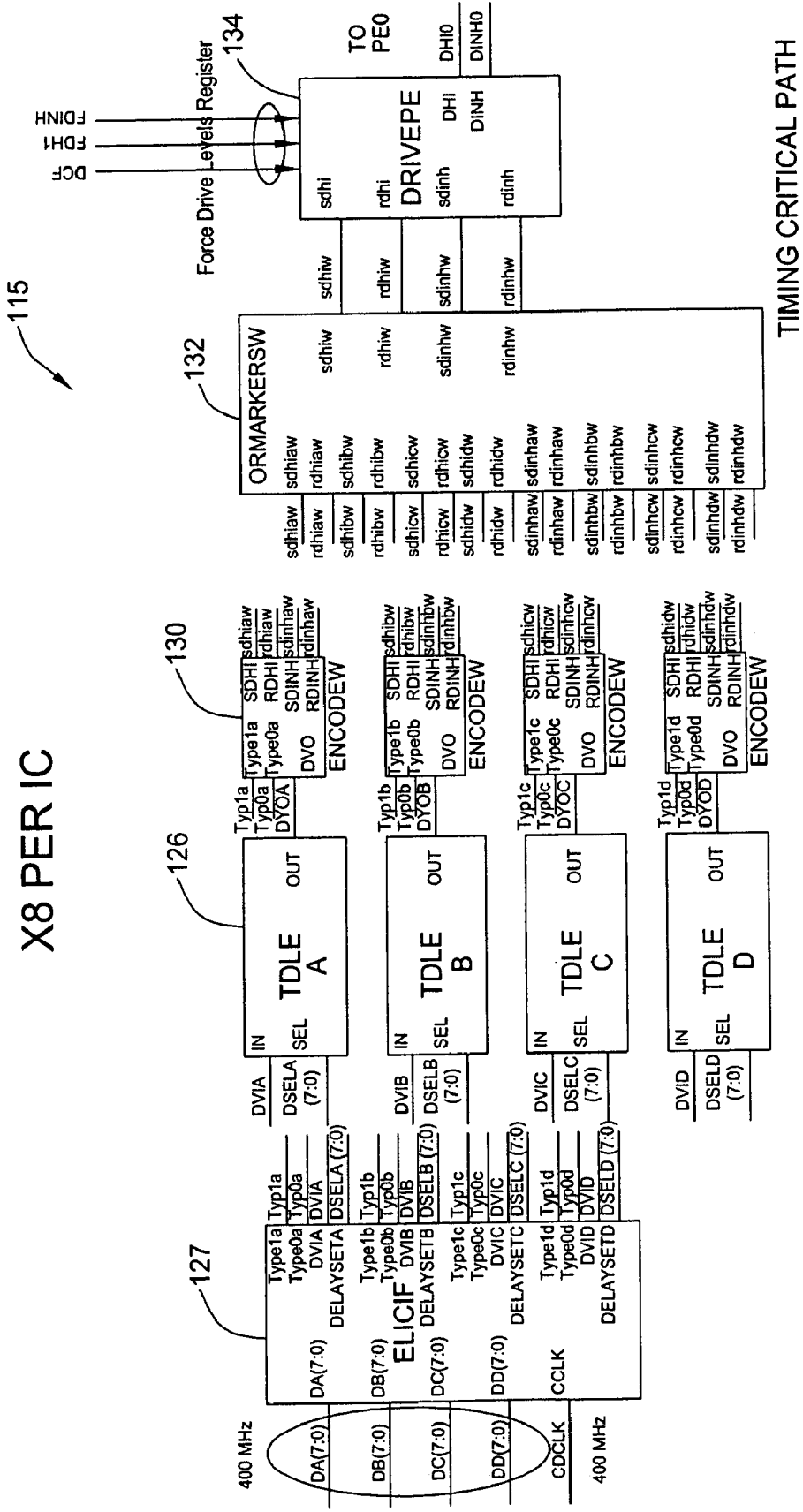
FIG. 4 is a diagram of a portion of the drive circuit for the formatter of FIG. 3.
Figure 8:
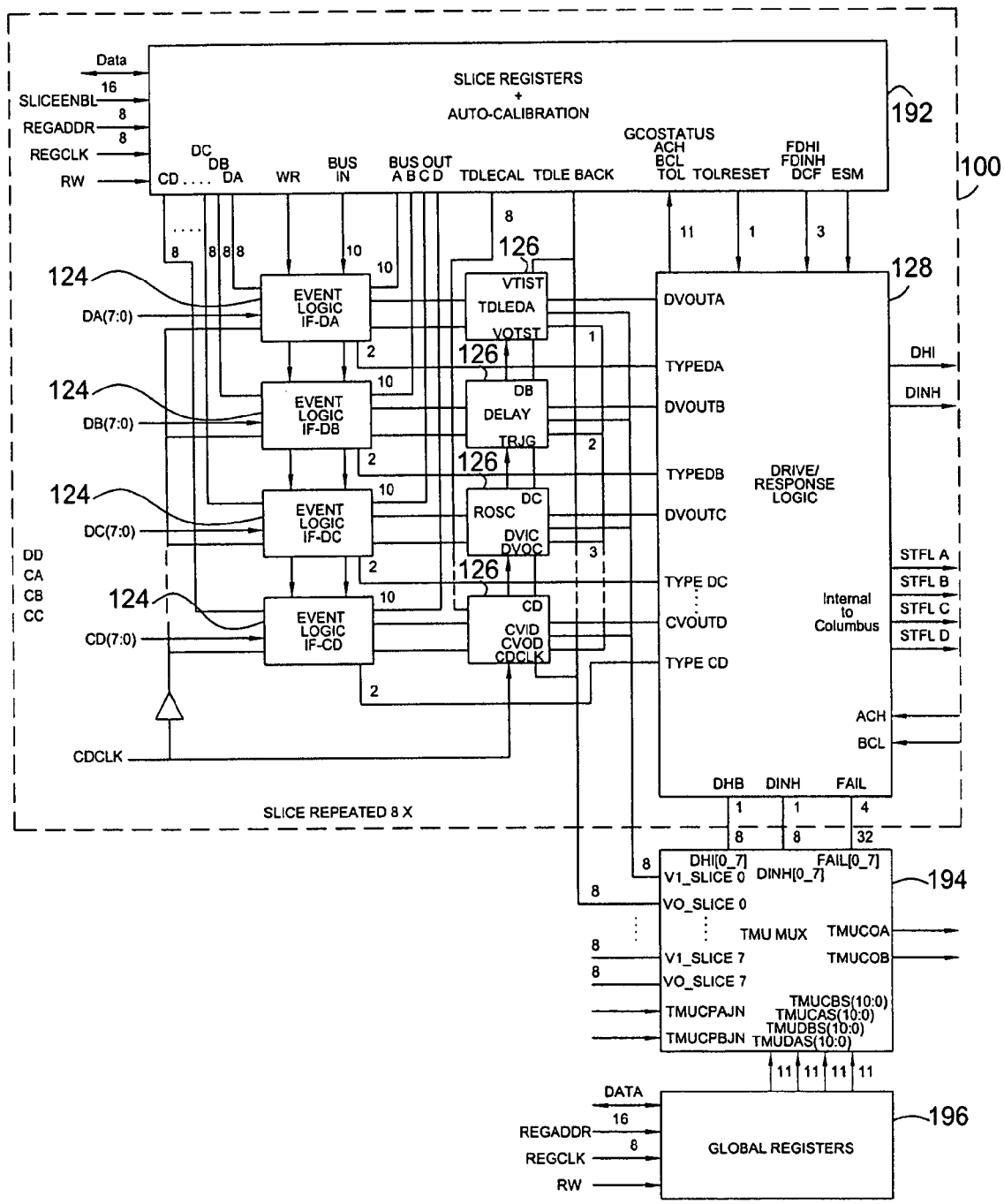
FIG. 8 is a diagram showing the formatter of FIG. 1 including both the drive circuit and the response circuit.

With reference to FIGS. 2, 3, 4 and 8, the drive circuit 115 includes a plurality of slices 120 (shown in FIGS. 2 and 8), a global timing measurement unit multiplexer (TMUMUX) 194, and a global register section 196. Each slice includes a slice register section 192, an event logic interface (ELIF) block 127, a plurality of, e.g., four, delay line elements (DLEs) 126, and drive logic 128. The ELIF block 127, sometimes also referred to as an ELICIF block, pairs with associated DLEs 126 to form channels, or "barrels" which pass data and timing signals to drive logic 128. The drive logic in turn outputs the desired formatted levels for driving DUT pins. The registers pertinent to the formatter and workings of the register bus are understood by those of skill in the art and will not be described further. With reference to FIGS. 3, 4, and 8, a brief description of each of the elements of the drive circuit now follows.

Overview of ELIF Block 127

With reference to FIGS. 1, 3, 4, and 8, in one embodiment, during run-time operation, e.g., at 400 MHz, the timing generation circuit 104 transmits two 8 bit half-words over two successive drive/response clock (DCCLK) cycles to each of the plurality of, e.g., eight, ELIF blocks 127 (shown in FIG. 4) located in the Drive Event Logic Interface 125 shown in FIG. 3. With reference to FIG. 3, one can label the thirty-two 8-bit (parallel) run-time data access ports to the drive circuit as DA*(0 . . . 7), DB*(0 . . . 7), DC*(0 . . . 7) and DD*(0 . . . 7) where * is 0 to 7 as shown in FIG. 3. Buses DA, DB, DC and DD carry 8 bits of delay data, 2 bits of event type [1:0] and 2 status bits called "tag" bits. The tag bits signal the end of a digital word. Responsive to data received on buses DA, DB, DC, and DD, the ELIF produces a delay signal (DSEL [7:0]), type signals (type1 and type0), and a delayed modified tag signal (DVI).

In one embodiment, one can ignore the four least significant bits (LSB) of delay data received in the second half of the timing word, as in one embodiment, these bits represent timing resolution finer than the minimum delay step size that certain embodiments of the drive circuit presently achieve. Essentially, in one embodiment, an ELIF block 127, in combination with associated DLEs and with the drive logic 128, decodes the timing delay information (8 bits) as well as the event type (2 bits) to generate desired formatted level(s), drive-high (DHI)/drive-inhibit (DINH) as shown in Table 1 below.

TABLE 1

Drive Circuit Event Types

| Type 1 | Type 0 | DINH | DHI |
| --- | --- | --- | --- |
| 0 | 0 | 1 | X |
| 1 | 0 | 0 | 0 |
| 1 | 1 | 0 | 1 |

(Type 1 = 0; Type 0 = 1 is ignored)

Overview of Delay Line Elements (DLE's) or "Barrels"

With reference to FIG. 4, in one embodiment, each DLE 126 receives delay data, i.e., DSEL, and the DVI signal (described above) from an associated ELIF block. In one embodiment, each DLE can move timing marker edges, i.e., the edges of an output signal DVO, in approximately 20 ps steps between the edges of a 385 MHz–420 MHz system clock. The DLEs can be tapped delay line elements. In one embodiment, each DLE includes a timing interpolator circuit. Each ELIF extracts a delay value from the 16-bit (having 12 useable bits in the illustrated embodiment) run-time word. With reference to FIG. 3, conceptually, the run-time delay values contained in the run-time word received from the ELIF block could be used to "look-up" a corresponding timing value in a relinearization table (RT) 118 that would in turn enable the DLE to generate the correct delay step. However, with reference to FIG. 2, in another embodiment, the timing generation circuit actually stores the RTs 118 and the timing generator performs the lookup function. The retrigger rate for each DLE is typically a known or specified value, e.g., 4 ns.

In one embodiment the DLE is a sine-cosine quadrature phase based timing interpolator circuit such as circuits available from Tality of Jackson Miss. Tality is associated with Cadence of San Jose, Calif. In an alternative embodiment, the DLE is a series of high-precision, high-accuracy MUXs chained together into a delay line with a robust control system. In yet another embodiment, the DLE could be a ramp generator circuit such as circuits sold by Maxim Integrated Products of Beaverton, Oreg. Maxim Integrated Products is headquartered in Sunnyvale, Calif. However, this embodiment will have timing errors of 300 ps or more because CMOS resistors (at least in the 0.18 u G TSMC process without poly resistors) have a +/−60% tolerance value.

Overview of Drive Logic Block

With reference to FIG. 3, the illustrated embodiment of the drive circuit provides formatted drive levels for eight independent DUT pins. This last statement combined with the 32 DLEs of FIG. 3 implies that the drive circuit merges four barrel (or DLE) outputs to form a single pair of formatted drive levels named DHI and DINH (also illustrated in FIGS. 4–6). FIG. 6 is a diagram showing a logical representation of a portion of the drive logic of the drive circuit of FIG. 3. With reference to FIG. 6, the drive circuit merges outputs of four barrels 170, 172, 174, 176 to form the single pair of formatted levels, DHI and DINH.

Having provided a brief description of elements of the drive circuit, a more detailed description now follows. FIG. 4 is a diagram of one embodiment of a slice of the drive circuit of FIG. 1. One embodiment of the drive circuit includes eight such slices. The slice includes an ELIF block 127. The ELIF block, as noted above, receives four data streams (on buses DA, DB, DC and DD, respectively), each data stream including 8 bits of delay data, 2 bits of event type [1:0] and 2 status bits called "tag" bits. The ELIF block outputs four data streams, each data stream including 8 bits of delay data, e.g., DSELA(7:0), two type signals, and one DVI signal.

ELIF In Greater Detail

Describing one embodiment of the ELIF block in greater detail, the schematic of FIGS. 16A and 16B shows inputs from bus di_dly*[7:0] which is a piped D(A,B,C or D) bus received from the timing generation circuit. (There are independent ELIF structures for decoding buses DA, DB, DC, DD, CA, CB, CC, and CD). The piped di_dly* bus bits are dissembled to yield type, tag, timing delay information (phisel/cursel in one embodiment or the Dsel signal of FIG. 4 in another embodiment). These dissembled bits, along with the DVI initiating trigger pulse (which the DLE derives from pulse_en shown in FIG. 16A) are issued by ELIF to the analog (DLE) block of FIG. 4 for generation of time critical markers, which are used by drive circuit to yield DHI/DINH chip outputs, or by strobe circuit to yield pass/fail information (STFL).

Referring to the left middle section of the schematic of FIG. 16A, the ELIF receives raw data from the timing generation circuit from buses D(A, B, C, or D) and C(A, B, C, or D) which is delayed by a pipe to produce di_dly* data. The di_dly* data is fed to a state machine 500 clocked by a master clock. The state machine 500 determines whether the word is early or normal by examining the tag bit referred to above. The state machine determines two different paths, i.e., early or normal, based on tag bit information. The outputs of the state machine, tag1_dly1 and tag0_dly2 are each passed through a chain of four flip-flops clocked by an early version of the master clock (mclk_e) to produce tag1_dly5 and tag0_dly6, respectively. The outputs of the state machine, tag1_dly1 and tag0_dly2 are also each passed through a chain of two flip-flops clocked by mclk_e to produce inputs (dutag1_dly3 and dutag0_dly4) to 2 input AND gates 502 and 504 and 2 input AND gates 506 and 508, respectively.

Referring now to the top left portion of FIG. 16A, a 2 input OR gate 510 receives signals dutag1_dly3 and dutag0_dly4 as inputs. The output of OR gate 510 is the control for a 2:1 Multiplexer (MUX) 512. The output of the MUX is fed to a flip flop 514 clocked by mclk_e. The complement of the data output of the flip flop 514 is fed back to the 1 input of the MUX 512. Similarly, the data output (typepathsel) of the flop flop 514 is fed back to the 0 input of the MUX and is provided as input to the 2 input AND gates 504 and 508. The complement of typepathsel is provided as input to the 2 input AND gates 502 and 506. The outputs of the AND gates 502, 504, 506, and 508 are inputs to 2 input AND gates 516, 518, 520, and 522, respectively.

A flip flop 511 clocked by the master clock (mclk) receives di[7:0] as input and its output is passed through two more flip flops clocked by mclk_e to produce d1_dly3, which forms the second input of 2 input AND gates 516 and 52. d1_dly3 is also the input to flip flop 513 whose output is d1_dly4, which forms the second input of AND gates 518 and 522. The output of AND gates 516 and 518 are inputs to OR gate 524. Similarly, the output of AND gates 520 and 522 are inputs to OR gate 526. The outputs of OR gates 524 and 526 each pass through a chain of two flip flops clocked by mclk_e and gclk2 (an even earlier version of the master clock than mclk_e), respectively, to produce typepath0 and typepath1.

A different portion 549 of the ELIF block, shown in the middle right portion of FIG. 16A, includes a 2 input AND gate 528 that receives tag1_dly2 and tag0_dly 4 as inputs. The output of AND gate 528 is an input of 2 input OR gate 530 that receives tag1_dly5 as the other input. The output of OR gate 530 is the input of flip-flop 532 which produces normal/early flag (i.e., ne_flag) as output. This signal is used to control a MUX in the DLE to block a spurious pulse associated with an early event described in greater detail below.

Yet another portion of the ELIF block shown in FIG. 16A includes a 2 input OR gate 534 which receives as input tag1_dly2 and tag0_dly3. The output of OR gate 534 passes through two flop flops 536 and 538 clocked by mclk_e to produce pulse_en3. The pulse_en3 passes through two more flip-flops 540 and 542 clocked by gclk2 to produce pulse_en. The pulse_en3 signal is also input to a flip flop 544 clocked by mclk_e. The output of flip flop 544, pulse_en_dly2 is the input of flip flop 546 also clocked by mclk_e, of 2 input AND gate 548 and 2 input OR gate 550. AND gate 548 and OR gate 550 also receive as inputs the output of flip flop 546. The outputs of AND gate 548 and OR gate 550 are the 0 and 1 inputs of 2:1 MUX 552. The output of MUX 552 is the input of flip flop 554 clocked by mclk_e. The output of flip flop 554 is the control of MUX 552.

Turning to the bottom left portion of the schematic shown in FIG. 16A, the ELIF includes two 2 input AND gates 556 and 558 that receive as input di_dly3[5:4] and dutag1_dly3, and di_dly4[5:4] and dutag0_dly4, respectively. The outputs of AND gates 556 and 558 form the inputs of 2 input OR gate 560, the output of which forms the input of flip flop 562 clocked by mclk_e. The complement of each bit of the 2 bit output of flip flop 562 forms the input of a 2 input AND gate 564. The output of the AND gate 564 along with an esm signal forms the input of a 2 input OR gate 566. The output of OR gate 566 and the pulse_en3 signal from flip flop 538 form the 2 inputs of 2 input AND gate 570. The output of AND gate 570 forms the input of flip flop 572 clocked by mclk_e. The output of flip flop 572 forms the input of flip flop 574 clocked by mclk_e. The outputs of flip flops 572 and 574 form the 0 and 1 date inputs of 2:1 MUX 576. Flip flop 554 forms the control input of MUX 576. The output of MUX 576 and the complement of a sel_norm signal form the two inputs of a 2 input AND gate which in turn forms the input to a chain of 5 flip flops all clocked by mclk_e to produce a c*failen signal.

Referring now to the top left portion of FIG. 16B, the illustrated embodiment of the ELIF includes 2 input AND gates 580, 582, and 584 which receive as inputs ringo&tdle_cal[en] and autoaddr[7:0], dutag0_dly3[en] and {di_dly3[3:0], di_dly2[7:4]}, and dutag1_dly2[en] and {di_dly3[3:0], di_dly1[7:4]}, respectively. The outputs of AND gates 580, 582, and 584 form the inputs of 3 input OR gate 586. The output of OR gate 586 is passed to flip flop 588 clocked by mclk_e to produce an output, e.g., dse1_mxin_del1, the [7:4] bits of which form the control for 16:1 MUX 594 and the [3:0] bits of which form the control for 16:1 MUX 602. The output of flip flop 588 passed through 2 more flip flops 590 and 592 to produce an output, e.g., strbdelay[7:0].

The output of MUXs 594 and 602 form the 1 data inputs of 2:1 MUXs 596 and 604, respectively. The control inputs of MUXs 596 and 604 is signal pulse_en4. The outputs of MUXs 596 and 604 form the inputs of flip flops 598 and 608 clocked by mclk_e. The outputs of flip flops 598 and 608 form the inputs of the 0 data input of MUXs 596 and 608, respectively. The outputs of flip flops 598 and 608 pass through flip flops 600 and 610, respectively, to produce two outputs, e.g., phisel[12:0] and cursel[9:0], respectively. An early clock signal, i.e., gclk2, clocks the flip flops 600 and 610.

Turning to the middle left portion of FIG. 16B, circuit 636 appears in only a portion of the ELIF. Four input AND gates 612 receives signals tag1_dly3, the complement of di_dly3[5], di_dly3[4], and ringo as inputs. AND gate 614 receives signals tag0_dly4, the complement of di_dly4[5], di_dly4[4] and ringo as inputs. The outputs of AND gates 612 and 614 form the inputs of 2 input OR gate 616, which produces and output that passes through 2 flip flops 618 and 620 clocked by mclk_e and gclk2, respectively, to produce an output, e.g., nextslc.

Turning to the bottom left portion of FIG. 16B, i.e., circuit 638, 4 input AND gate 622 receives signals di_dly3[5], di_dly3[4], ringo, and tag1_dl3 as inputs. 4 input AND gate 624 receives di_dly4[5], di_dly4[4], ringo, and tag0_dly4 as inputs. 3 input OR gate receives startosc, stoposc, and nextslc as inputs. 2 input AND gate 628 receives the output of OR gate 626 as inputs. AND gates 622, 624, and 628 form the 3 inputs of a 3 input OR gate 630 which produces an output that passed through 2 flip flops 632 and 634 clocked by mclk_e and gclk2 respectively to produce an output, e.g., readuporlow.

Embodiments of the invention use circuits 636 and 638 to control the auto-calibration circuit described further below.

The architecture shown in FIGS. 16A and 16B is generally common to all channels.

Returning to FIGS. 2, 3, 4, and 8, each DLE 126 receives the DVI signal (more precisely, the pulse_en signal) and the delay data and then outputs a DVO signal to the drive logic 128. In one embodiment, the drive logic 128 (shown in FIG. 3) of the drive circuit includes an encode circuit 130, an or-marker circuit 132, and a drive-PE circuit 134 (all shown in FIG. 4).

Drive Logic in Greater Detail

The encode circuit 130 receives the DVO signal from an associated DLE 126 and two type signals from an associated ELIF block and outputs four internal markers. In other words, each 2-bit run-time event type is decoded as one of a set of internal markers: setdhi, resetdhi, setdinh or resetdinh.

Figure 5:
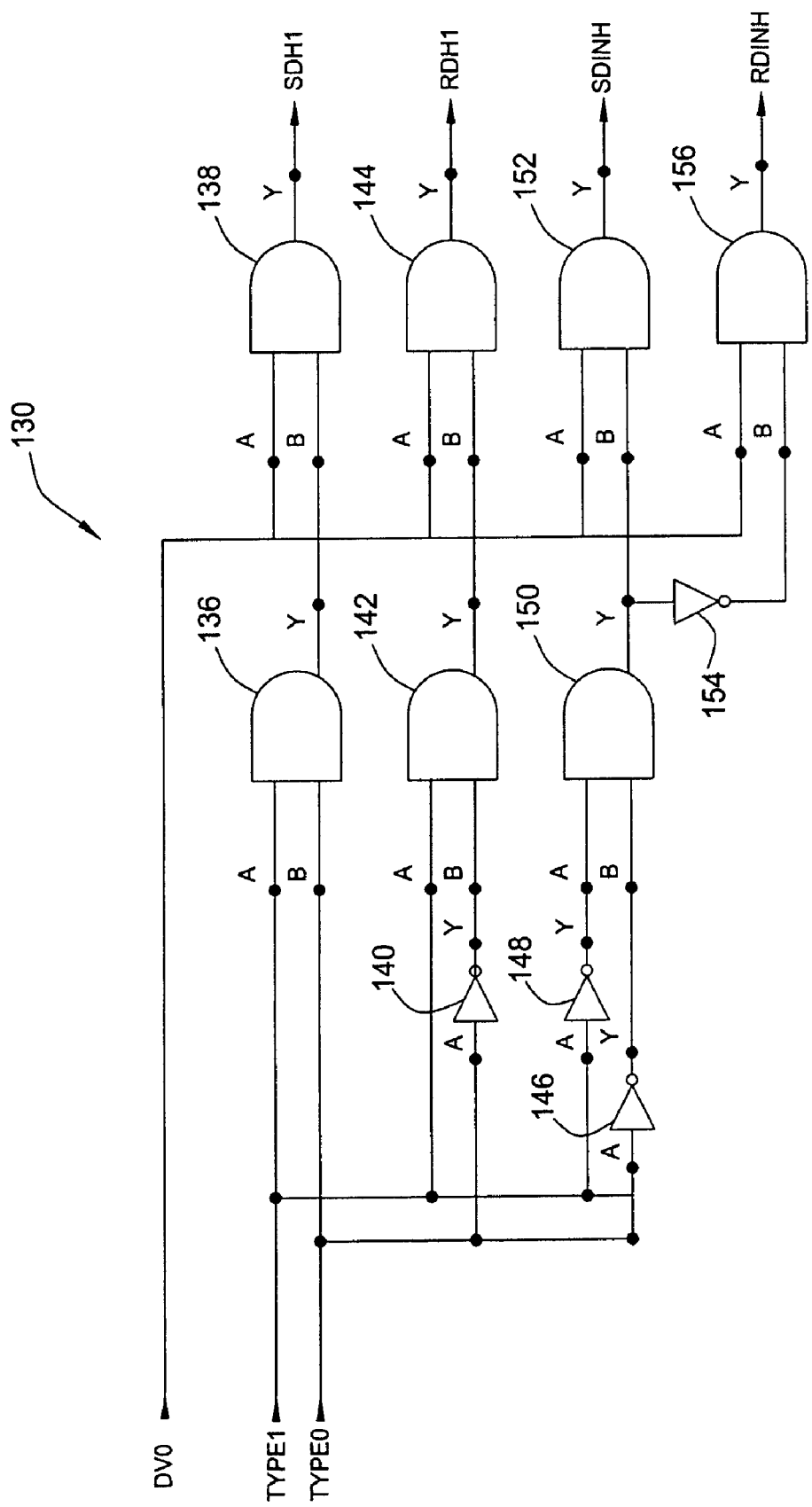
FIG. 5 is a logical representation of the encode component of the portion of the drive circuit of FIG. 4.
Figure 6:
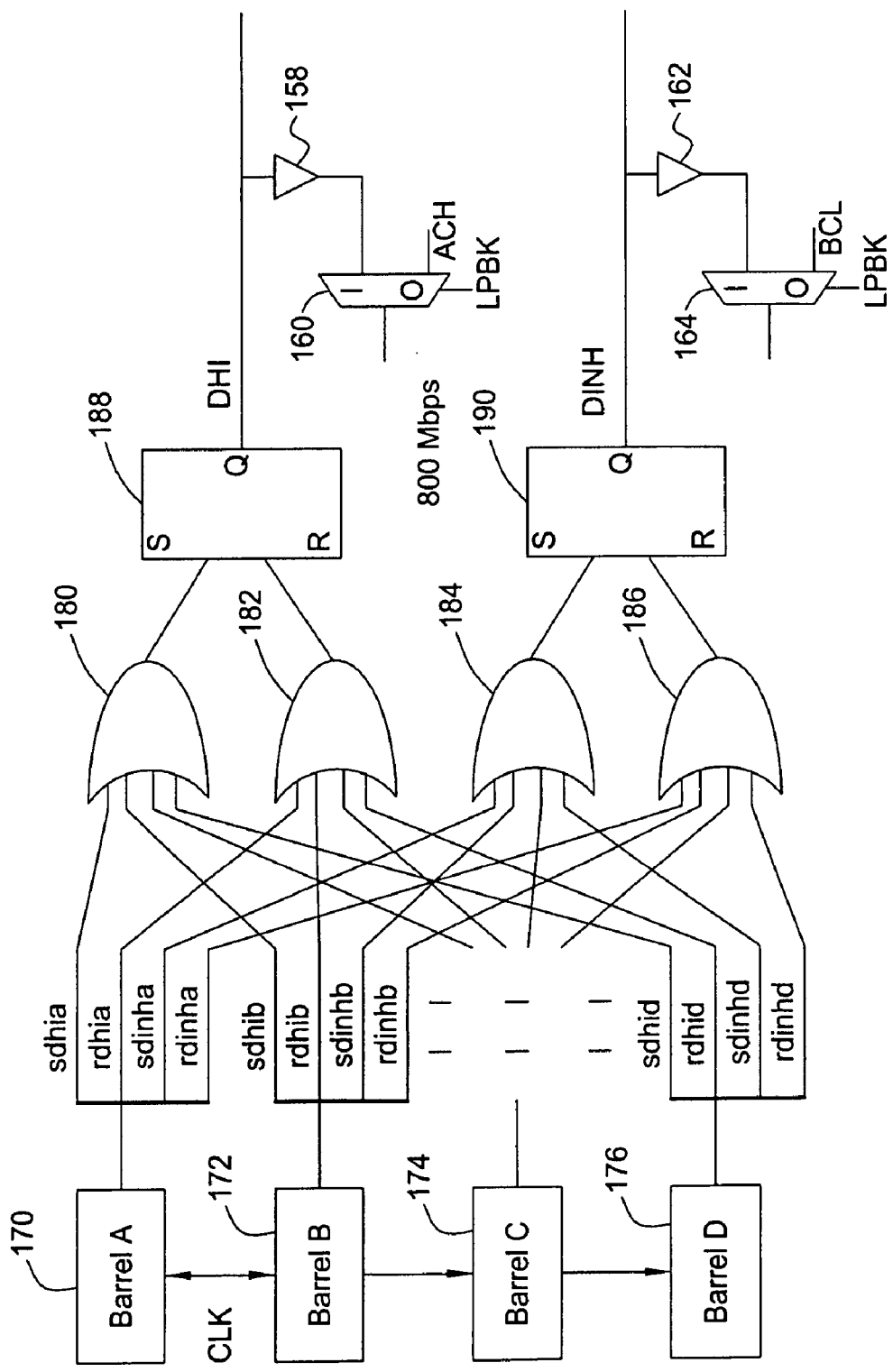
FIG. 6 is a diagram showing a logical representation of a portion of the drive logic of the drive circuit of FIG. 3.

More specifically, with reference to FIG. 5, one embodiment of the encode circuit 130 includes AND gates 136, 138, 142, 144, 150, 152, and 156 and inverters 140, 146, 148, and 154. AND gate 136 has an output and two inputs for receiving two type signals, type 1 and type 2. Inverters 140, 146, and 148 invert type 1, type 0, and type 1 signals, respectively. AND gate 142 has an output and two inputs for receiving a type 1 signal and the output of inverter 140. AND gate 150 has an output and two inputs for receiving the inputs of inverters 146 and 148.

AND gate 138 has two inputs for receiving a DVO signal and the output of AND gate 136 and an output for providing a setdhi (sdhi) signal. AND gate 144 has two inputs for receiving a DVO signal and the output of AND gate 142 and an output for providing a resetdhi (rdhi) signal. AND gate 152 has two inputs for receiving a DVO signal and the output of AND gate 150 and an output for providing a setdinh (sdinh) signal. Inverter 154 inverts the output of AND gate 150. AND gate 156 has two inputs for receiving a DVO signal and the output of inverter 154 and an output for providing a resetdinh (rdinh) signal.

As noted above, FIG. 6 is a diagram showing a logical representation of a portion, i.e., of an or-marker circuit 132 and a drive-PE circuit 134 (shown in FIG. 4), of the drive logic of the drive circuit (shown in FIG. 3). FIG. 6 illustrates an example of the operation of drive logic 128 (shown in FIG. 3) in the generation of formatted signals DHI and DINH. It should be noted that FIG. 6 is a functional depiction, using logic gate representations, of a portion of drive logic 128. In practice, one implements the drive logic 128 as a combination of digital logic components, e.g., logic gates and multiplexers, as well as set and reset registers and latches. FIG. 6 illustrates only a portion of the drive logic. In one embodiment, there are a plurality of, e.g., eight, equivalent circuits to the one being represented by FIG. 6. The drive logic 128 generates internal timing markers, e.g., sdhiaw, sdhibw, sdhicw and sdhidw, based upon the timing markers and event type information that the drive logic 128 receives from ELIF/DLE pairs (barrels) A, B, C and D 170–178. The drive logic relays internal timing markers sdhiaw, sdhibw, sdhicw and sdhidw to an OR-logic gate 180 and the output of the OR-logic gate 180 sets the set input of a Set/Reset latch 188.

The "set" signal, in this instance, implies that the user has set the formatted signal DHI to logic high. As a consequence, the formatted signal DHI (set to logic high) results at the output of the Set/Reset latch 188. Similarly, the drive logic relays internal timing markers rdhiaw, rdhibw, rdhicw and rdhidw to an OR-logic gate 182 and the output of the OR-logic gate 182 resets the Set/Reset latch 188. As a consequence, the formatted signal DHI (set to logic low) results at the output of the Set/Reset latch 188.

The drive logic 128 also generates internal timing markers sdinhaw, sdinhbw, sdinhcw and sdinhdw based upon the timing markers and event type information the drive logic 128 receives from the ELIF/DLE pairs A, B, C and D 170–178. The drive logic relays these internal timing markers to an OR-logic gate 184 and the output of the OR-logic gate 184 sets the set input of a Set/Reset latch 190. The "set" signal, in this instance, implies that a user has set the formatted signal DINH to logic high. As a consequence, the formatted signal DINH (set to logic high) results at the output of the Set/Reset latch 190. Similarly, the drive logic can generate internal timing markers rdhiaw, rdhibw, rdhicw and rdhidw and relay these timing markers to OR-logic gate 186. The output of the OR-logic gate 186 resets the Set/Reset latch 190. As a consequence, the formatted signal DINH (set to logic low) results at the output of the Set/Reset latch 190.

Figure 7:
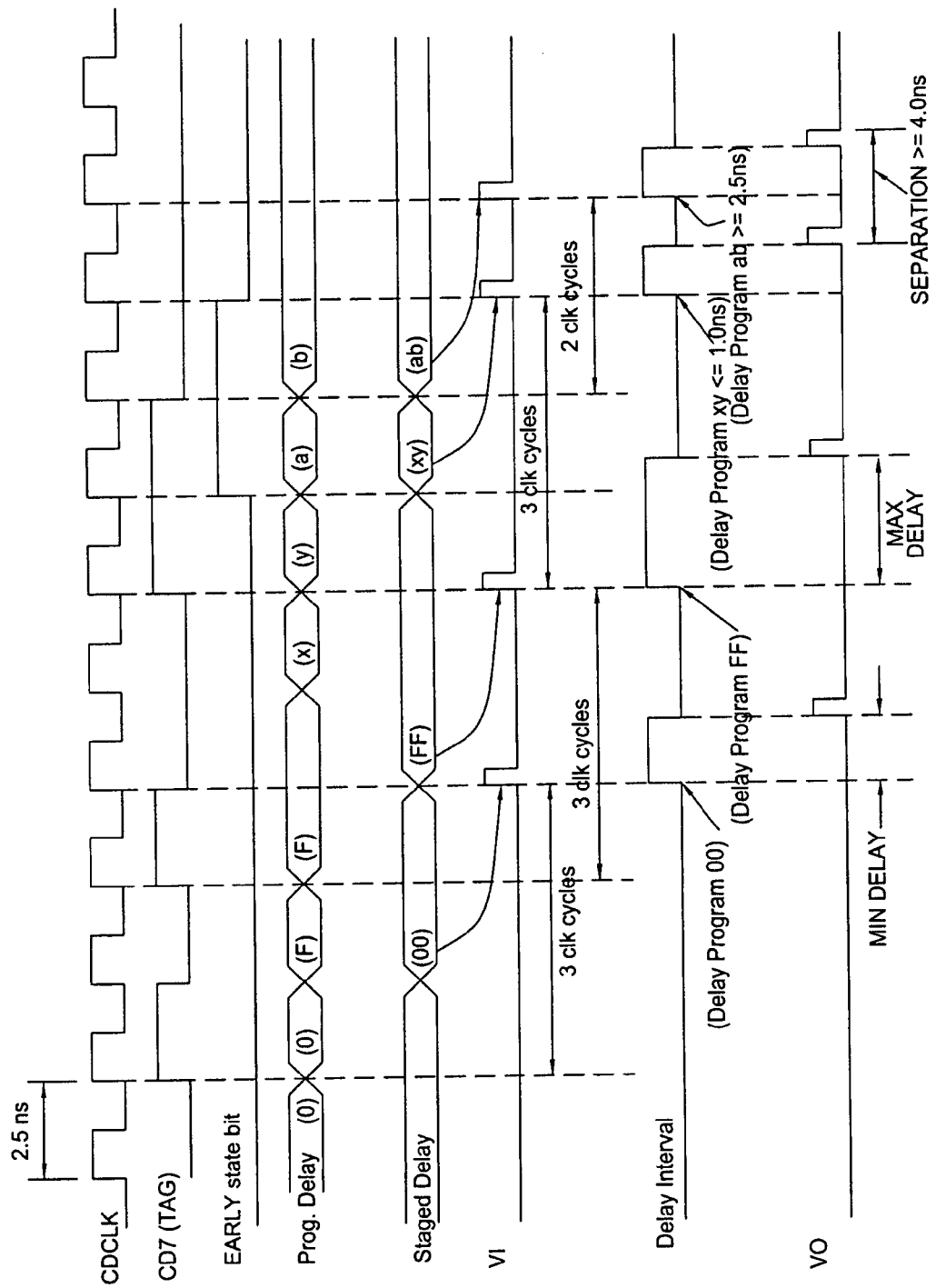
FIG. 7 is a data flow timing diagram for the formatter of FIG. 1.

Having described the components of the drive circuit of the formatter of FIG. 1, a description of one embodiment of a functional timing diagram shown in FIG. 7 now follows. FIG. 7 is a functional timing diagram applicable to the drive path. Proceeding from top to bottom, the first line labeled CDCLK shows a signal provided by a system clock, e.g., a 400 megahertz clock. The drive circuit receives a clock signal every 2.5 ns.

The next line labeled CD7 shows a signal provided by a tag bit, one of the bits (bit 7) in a software word received by the ELIF. When the tag bit is active, it is an indication to the drive circuit that the drive circuit has received a new software word. A software word is transported over two cycles, e.g., two 2.5 nanoseconds cycles. As a consequence, in two cycles, e.g., in 5 nanoseconds, the drive circuit receives a tag bit. The first tag pulse shown on line CD7 of FIG. 7 is associated with the second half of a software word. When a tag pulse is associated with the second half of a software word, i.e., after a non-asserted level, it is a normal event. This first asserted tag bit is followed by a 0 or a non-asserted level followed by another tag pulse or asserted level.

The drive circuit determines whether a tag bit is occurring early and indicates such a condition using an early state bit which is illustrated in the third line down from the top labeled "EARLY state bit." An asserted EARLY state bit dynamically impacts how the subsequent logic acts. Returning to the CD7 time line, after the second tag pulse, there is a period of non-assertion and then there are two consecutive tag pulses. Such a condition indicates an early word, meaning in the illustrated example that the two events associated with the two tag pulses, were separated only by 2.5 nanoseconds when they were applied to the drive circuit, rather than the more typical 5 nanoseconds. An output of the appropriate ELIF, e.g., a DVI signal, is shown on the line labeled "VI" (6 lines down from the top). The VI signals occur three clock cycles after the rising edge of the associated tag pulse for a normal event. However, if there is an early event, the associated VI signal occurs two clock cycles after an associated tag pulse.

The line labeled "Prog Delay" (4 lines down from the top) shows the programmed delay encoded in the two halves of software words received by an ELIF. The programmed delay is shown using hexadecimal representation. The next line down labeled "Staged Delay" (5 lines down from the top) shows the delay derived by an ELIF from the two halves of received software words, 00 being the minimum delay, e.g., 0 seconds, and FF begin the maximum delay, e.g., 2.5 nanoseconds. The line labeled "Delay Interval" (7 lines down from the top) shows signals that begin at times indicated by the timing markers provided by the VI signal and last for periods indicated by associated staged delay signals. Finally, the line labeled "VO" (8 lines down from the top) shows the output of the DLE, e.g., the DVO signal. This signal has a rising edge that is triggered by the falling edge of the delay interval signal.

Returning to the discussion of an early event, in one embodiment the formatter has a retrigger rate requirement for the DLE of a specified value, e.g., 4 ns. A retrigger rate requirement indicates that the DLE typically cannot produce a current rising edge until a specified amount of time, e.g., 4 ns, has elapsed from the creation of the rising edge immediately prior to the current rising edge. Given such a retrigger rate requirement, when the formatter detects an early event, the formatter performs a timing overload (TOL) check. A TOL check ensures that the programmed delay of the first word associated with the early event is less than a specified value, e.g., 1 ns, and that the programmed delay of the second word associated with an early event is greater than a specified value, e.g., 2.5 ns, such that the retrigger rate for the DVO signal is greater than or equal to a specified value, e.g., 4 ns.

With reference to FIGS. 15A and 15B, the TOL flag can be issued when there is a retrigger rate violation for either early or normal events. In one embodiment, the ELICIF contains two digital comparators (one for early and one for normal events) which compare the difference in the programmed delay value of two successive events. In case of early events, the delay bits for the two successive events are spaced by 2.5 ns. For normal events, the two successive events are spaced by 5.0 ns. In either case, the digital comparators raise the flag, if the programmed values for the two events are closer than 4.0 ns.

One embodiment of the TOL circuit for detecting early events is shown in FIG. 15A and includes a first flip-flop 460 for receiving data from an ELIF. The first flip-flop 460 has an output labeled DX that is coupled to a data input for a second flip-flop 462. DX is the timing of pulse X. The second flip-flop 462 has an output labeled DY that is coupled to a data input of a digital comparator 464. DY is the timing of pulse Y. The digital comparator has an input coupled to DX, the data output of the first flip-flop 460. Flip-flops 460 and 462 and digital comparator 464 are clocked by the master clock and reset by a reset signal. The digital comparator is conventional and determines whether DY-DX<1.5 ns and outputs a early TOL signal based on that determination.

Similarly, a TOL circuit for detecting normal events is shown in FIG. 15B and includes a first flip-flop 466 for receiving data from an ELIF. The first flip-flop 466 has an output labeled DX that is coupled to a data input of a second flip-flop 468 which in turn is coupled to a third flip-flop 470. The third flip-flop 470 has an output DY that is coupled to a first data input of a digital comparator 472. The digital comparator has a second data input coupled to the output DX of the first flip-flop 466. Flip-flops 466, 468 and 470 and digital comparator 472 are clocked by the master clock and reset by a reset signal. The digital comparator is conventional and determines whether DY-DX<1.0 ns and outputs a normal TOL signal based on that determination. The etol and ntol signals are internal to ELICIF, and are used to generate the "tol" flag which is written to a local register. If there is a TOL violation, the TOL check circuitry described above produces a high level in a register. Testing software for use with the invention periodically polls the register and if the system (e.g., the combination of test software and hardware) reads a violation then the testing software stops the test and recommends that the user recheck the testing instructions.

With respect to the software that operates with the claimed invention, the software configures the hardware, monitors the runtime behavior, and datalogs passes and fails for a particular device. In one embodiment, the software can be one of a variety of programs known to those of skill in the art such as a program called Sapphire XTOS available from NPTest of San Jose, Calif. In another embodiment, a field programmable array can be programmed to provide appropriate stimuli to the claimed invention.

Returning to FIGS. 2–4, 6, and 8, in one embodiment, DHI and DINH can have pulse widths as narrow as 1 ns wide. In one embodiment, the maximum data rate for these signals is 800 MTPS, delivered to the pin-electronics with an edge placement accuracy of +/−81 ps or better, with respect to the master clock driving the timing generation IC. Similarly, in one embodiment, either the rising or the falling edges of the formatted levels can be moved in steps of 20 ps over a delay range 0–2.5 ns. Alternatively, a user, by setting appropriate bits in a software register called PECONTROL (not shown), can force the DHI and DINH levels at the output(s) to specified levels. One activates this feature during the calibration of pin-electronics described further below.

TMUMUX Section

Figure 9:
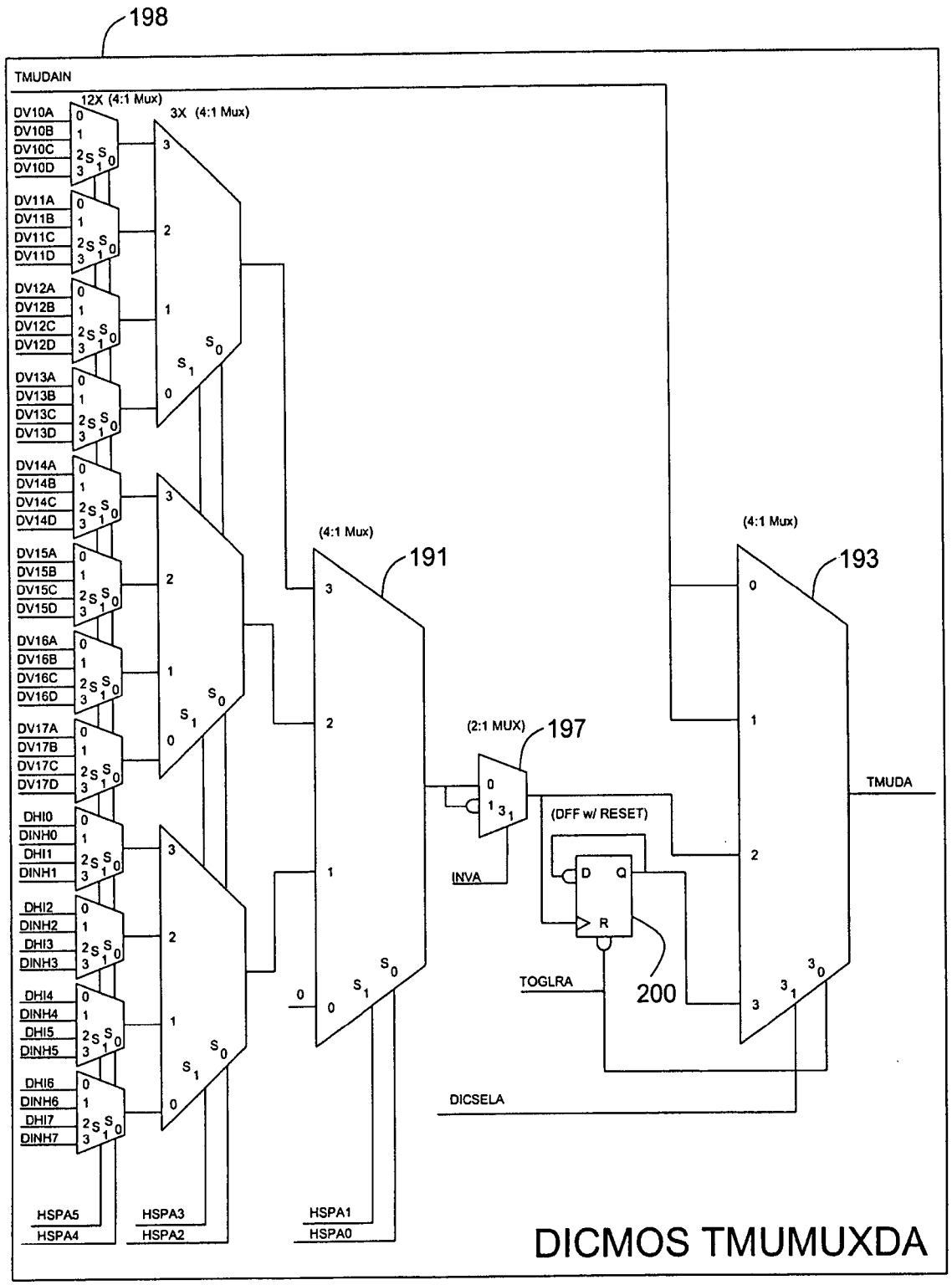
FIG. 9 is a diagram of a timing measurement unit multiplexer (TMUMUX) section coupled to the drive circuit of FIG. 3.

With reference to FIG. 9, in one embodiment the drive circuit also includes a high-speed timing measurement unit multiplexer (TMUMUX) section for providing high-speed system diagnostics. FIG. 9 shows a drive portion 198 of the global TMUMUX 194 (shown in FIG. 8). The drive portion 198 contains two high-speed TMUMUXs, TMUMUXA and TMUMUXDB (not shown but similar to TMUMUXDA other than replacing DVI signals with DVO signals for inputs to a first set of 4:1 multiplexers and having B versions of all control signals and outputs).

In one embodiment, TMUMUXDA includes 12 4:1 MUXs coupled to 3 4:1 MUXs coupled to a single 4:1 MUX 191. The 12 4:1 MUXs receive as input: 1) the DHI/DINH signals; and 2) signals DVI*A, DVI*B, DVI*C and DVI*D, where *=0–7, i.e., the triggering inputs to the DLEs 126. The output of the single 4:1 MUX 191 and the complement of that output are the two inputs for a 2:1 MUX 197. The output of the 2:1 MUX is one input to another 4:1 MUX 193 and to the clock input of a toggle flipflop 200. The 2:1 MUX for TMUMUXDA (TMUMUXDB) has a control signal INVA (INVB). The flipflop's output is tied to a second input of the 4:1 MUX 193 and the complement of the flipflops's output is tied to the flipflop's data input. Finally, a signal TMUDAIN is tied to the other two inputs of the 4:1 MUX 193.

Control signals, e.g., HSPA* where *=0–5, TOGLRA and DICSELA and the section B equivalents, determine which signals are routed through the TMUMUXDA and TMUMUXDB. More specifically, HSPA 4 and 5 control the group of 12 4:1 MUXs, HSPA 2 and 3 control the group of 3 4:1 MUXs, HSPA 0 and 1 control the 4:1 MUX 191, and TOGLRA and DICSSELA control the 4:1 MUX 193. In addition, the complement of the TOGLRA resets the toggle flipflop 200. More generally, one embodiment of a test system according to the invention controls MUXs in the drive portion of the TMUMUX section to select which of the many internal timing signals (generated by the drive circuit) the TMUMUX routes, through outputs TMUDA and TMUDB, to a system timing measurement unit (TMU) for calibration and/or diagnostic purposes. In one embodiment, the system TMU that receives signals from the TMUMUX is built directly on a printed circuit board out of resistors, capacitors, operational amplifiers and latches. In one embodiment the TMU is a timing interval analyzer (TIA) such as TIAs available from GuideTech of Sunnyvale, Calif. In another embodiment, the TMU is a TMU available from NPTest of St. Etienne, France. NPTest is headquartered in San Jose, Calif.

One embodiment of the TMUMUX operates as follows. The drive circuit routes two input signals TMUDAIN and TMUDBIN to TMUMUXA 198 and TMUMUXDB (not shown), respectively, to measure their marker locations with a high degree of accuracy and resolution. In one embodiment, the resolution is 20.833 ps and the net accuracy is +/−60 ps. The TMUDAIN/TMUDBAIN signals are arbitrary signals coming from an external source. For a given application, arbitrary signals on the PCB can be routed to these pins for strobing. As noted above, signals DVI*A, DVI*B, DVI*C and DVI*D, where *=0–7 are the triggering inputs to their respective DLEs 126, while signals DVO*A, DVO*B, DVO*C, and DVO*D, where *=0–7, are the timing marker outputs from their respective DLEs 126. In one embodiment, the drive circuit routes these signals as well as the DHI and DINH signals to a 2:1 MUX 197 and an associated 2:1 MUX in TMUMUXDB.

Each toggle flip-flop, i.e., flip-flop 200 and an associated flip-flop in TMUMUXDB, has a clock input coupled to the output of the associated 2:1 MUX. As a result, the toggle flip-flops select either very short pulses or generate signals whose edges are timed by very short pulses. The drive circuit routes the pulses through the multiplexers in such a way that the toggling of the flip-flops, i.e., flip-flop 200 and an associated flip-flop in TMUMUXDB, can take place on either the signals' leading or trailing edges. More specifically, if the same pulse is passed to the 2:1 MUX 197 in TMUMUXDA and the associated 2:1 MUX in TMUMUXDB and if signal INVA on 2:1 MUX 197 is the complement of signal INVB on the associated 2:1 MUX in TMUMUXDB, then the flip-flops of TMUMUXDA and TMUMUXDB will trigger on the rising and falling edge, respectively, of the pulse being measured. The TMUMUX section transmits the resulting TMUDA and TMUDB signals to an off-chip TMU to measure the distance between the TMUDA and TMUDB signals and, as a result, to measure the width of the pulse in question.

In one embodiment, the layout designer matches on-chip propagation delays for all internal DLE markers (DVO*), which the drive circuit routes through TMUMUXDB, and their triggers (DVI*) which the drive circuit routes through TMUMUXDA, to preserve accuracy and assure proper marker alignment under various PVT (Process Voltage Temperature) conditions.

Having described embodiments of a drive circuit of the formatter of FIG. 1, a description of the response circuit now follows.

The Response Circuit

With reference to FIGS. 8 and 10, the response circuit 117 includes a plurality of slices 120, a global timing measurement unit multiplexer (TMUMUX) 194, and a global register section 196. Each slice includes a slice register section 192, an event logic interface (ELIF) block made up of ELIF components 124, a plurality of, e.g., four, delay line elements (DLEs) 126, and strobe/response logic 128. In one embodiment, each ELIF component 124, sometimes also referred to as an ELICIF, pairs with an associated DLE 126 to form a channel, or "barrel" which passes data and timing signals to strobe/response logic 128. The response logic 128 in turn outputs the desired strobe markers for strobing signals received from DUT pins via the PE device.

The register section 192 receives control setup information from the external FPGA 122 (shown in FIG. 2), which includes signal REGCLK. As noted above with respect to the drive circuit, the registers pertinent to the formatter and workings of the register bus are understood by those of skill in the art and will not be described further.

Also shown in FIG. 10 is an error correlator circuit 202 for receiving strobe fail signals from the strobe logic 128. The error correlator circuit serves to datalog the fails as is understood by those of ordinary skill in the art.

Generally, the response circuit 117 of FIG. 10 generates strobe timing markers, such as StbHi, StbLo, StbOff, and StbZ, which the response circuit uses to strobe signals ACH and BCL provided by a comparator block of a pin-electronics circuit to determine whether a DUT pin passes or fails the test pattern provided by drive circuit 115 (shown in FIG. 3). If the state of signals ACH and BCL is different from that which is indicated by an associated event type, the response circuit generates a "fail" signal and transmits the fail signal to the error correlator circuit 202. In one embodiment, the strobe logic produces 32 "fail" signals and the labels STFL*A–D, where * ranges from 0–7 refer to these signals. With reference to FIGS. 8 and 10, a brief description of each of the elements of the response circuit now follows.

ELIF

The response circuit uses similar ELIF circuitry as the drive circuit. Run-time data (CA, CB, CC and CD) for the response circuit, however, consists of delay values associated with strobe marker generation. The event type data extracted from a software word, e.g., a 16 bit (having 12 useable bits) software word, contains information about whether the marker to be generated is StbOff, StbZ, StbLo or StbHi.

TABLE 2

Response Circuit Event Types

| Type | [1:0] | Description |
| --- | --- | --- |
| 0 | 0 | Strobe Off |
| 0 | 1 | Strobe Z |
| 1 | 0 | Strobe Lo |
| 1 | 1 | Strobe Hi |

Strobes cause a pass or fail according to the state of the compare signals at strobe time:
Strobe Z passes if ACH is a 0 and BCL is a 0 during strobe time, otherwise it causes a fail
Strobe Lo passes if BCL is a 1 during strobe time, otherwise it causes a fail
Strobe Hi passes if ACH is a 1 during strobe time, otherwise it causes a fail
Note that if both BCL and ACH are 1, either Strobe Lo or Strobe Hi will pass - this is normally an invalid condition.

DLEs

The response circuit and the drive circuit share similar DLE architecture, and the operation is alike, as well, except that the DLEs generate strobe markers, i.e., CVO signals, instead of timing markers, i.e., DVO, in response to the timing delay values received from ELIF.

Strobe Logic Block

Figure 11:
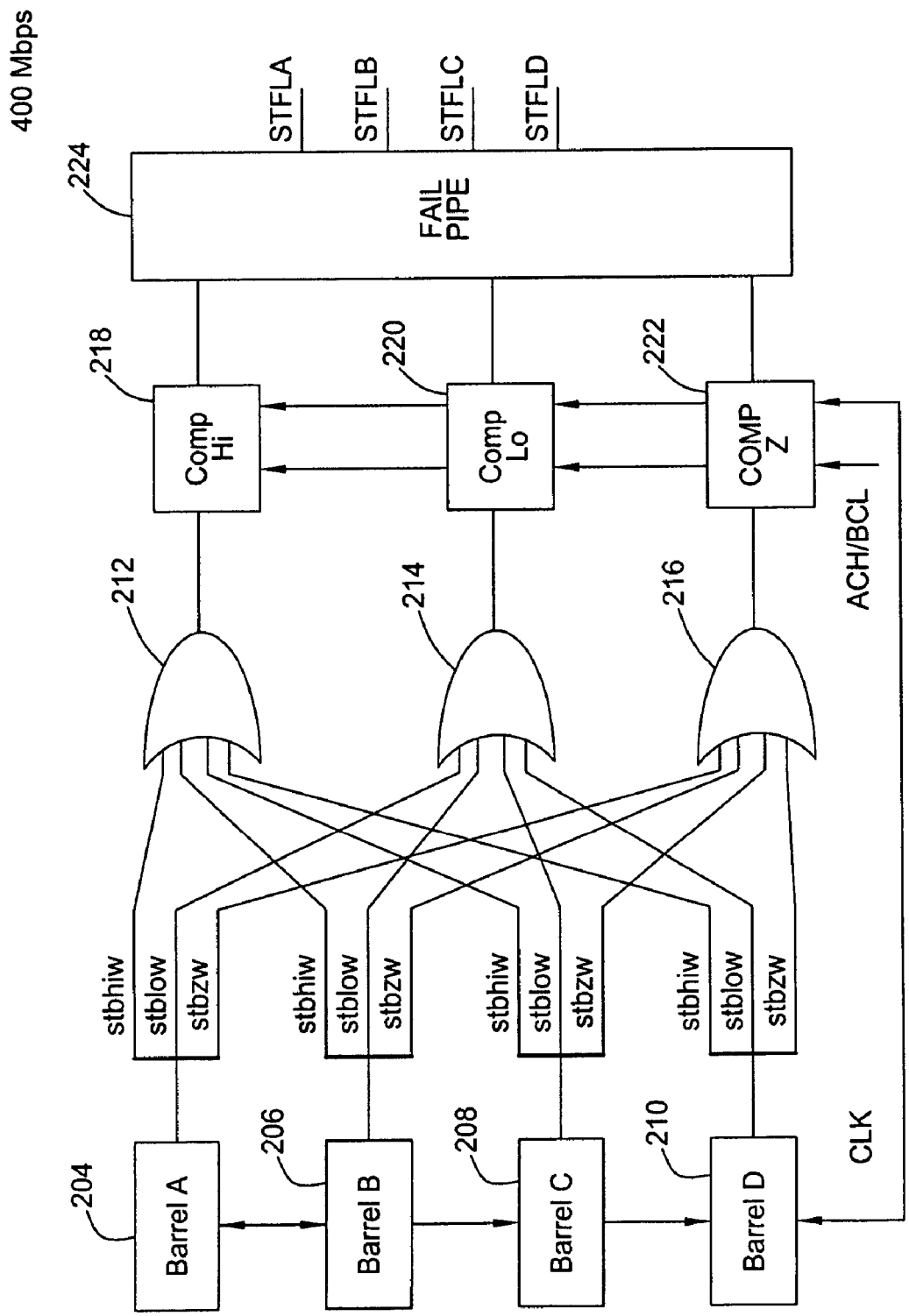
FIG. 11 is a diagram showing a logical representation of the response logic of the response circuit of FIG. 10.

With reference to FIGS. 10 and 11, the response/strobe logic 128 receives signals ACH (Above Comparator High) and BCL (Below Comparator Low) output by the pin-electronics comparator(s). At the same time, it uses the strobe markers to sample the ACH and BCL signals. If the state of theses signals is different from that which is indicated by the event type, the strobe logic generates "fail" signal(s). With reference to FIG. 11, the drive circuit merges outputs of four barrels 204, 206, 208, 210 to strobe the ACH/BCL signals and to form a set of strobe fail signals STFL* where *=A, B, C, D.

Having provided a brief description of elements of the response circuit, a more detailed description now follows. FIG. 11 illustrates how the response circuit merges strobe markers from four DLEs together to strobe ACH/BCL outputs from a pin-electronics comparator corresponding to a DUT pin. It should be noted that FIG. 11 is a functional depiction, using logic gate representations, of the response circuit. In practice, one implements the response/strobe logic using a combination of digital logic components, e.g., logic gates and multiplexers, as well as set and reset registers and latches.

The strobe/response logic 128 (shown in FIG. 10) generates internal strobe markers, e.g., stbhiaw, stbhibw, stbhibw and stbhibw (shown in FIG. 11), based upon the timing markers and event type information the strobe/response logic 128 receives from ELIF/DLE pairs A, B, C and D. The response logic relays internal strobe markers stbhiaw, stbhibw, stbhibw and stbhibw to an OR-logic gate 212 and the response logic supplies the output of the OR-logic gate 212 to the input of a Hi comparator 218. The Hi comparator also receives ACH and BCL signals for comparing the ACH and BCL signals with a strobe Hi marker received from the OR-logic gate 212. Finally, the strobe logic passes the output of the Hi comparator 218 to a fail pipe 224.

Similarly, the strobe/response logic 128 generates internal strobe markers, e.g., stbloaw, stblobw, stblobw and stblobw, based upon the timing markers and event type information the strobe/response logic 128 receives from the ELIF/DLE pairs A, B, C and D. The response logic relays internal strobe markers stbloaw, stblobw, stblobw and stblobw to an OR-logic gate 214 and the response logic supplies the output of the OR-logic gate 214 to the input of a Lo comparator 220. The Lo comparator also receives ACH and BCL signals for comparing the ACH and BCL signals with a strobe Lo marker received from the OR-logic gate 214. Finally, the strobe logic passes the output of the Lo comparator 220 to a fail pipe 224.

Furthermore, the strobe/response logic 128 generates internal strobe markers, e.g., stbzaw, stbzbw, stbzbw and stbzbw, based upon the timing markers and event type information the strobe/response logic 128 receives from the ELIF/DLE pairs A, B, C and D. The response logic relays internal strobe markers stbzaw, stbzbw, stbzbw and stbzbw to an OR-logic gate 216 and the response logic supplies the output of the OR-logic gate 216 to the input of a Z comparator 222. The Z comparator 222 also receives ACH and BCL signals for comparing the ACH and BCL signals with a strobe Z marker received from the OR-logic gate 216. Finally, the strobe logic passes the output of the Z comparator 222 to a fail pipe 224. In response to the outputs of the Hi, Lo, and Z comparators 218, 220, 222 the fail pipe 224 outputs strobe fail signals STFL* where *=A, B, C, D.

Having described the components of the receive circuit of the formatter of FIG. 1, reference is made to one embodiment of a functional timing diagram applicable to the response circuit and shown in FIG. 7. A description of FIG. 7 was presented above with respect to the drive circuit. The functional timing diagram of FIG. 7 is generic to both the drive path and the strobe path. In the drive path, physical pulses are generated and transmitted out of the formatter. In the strobe/receive path, pulses are not passed off chip, but rather the formatter uses the strobe markers to strobe ACH/BCL signals being received by the formatter. The functional timing diagram shows the progression of the strobe path up to the point that the DLEs produce the VO signals, i.e., the CVO signals. Having provided a description of the elements of the receive circuit and having referenced a functional timing diagram for a portion of the strobe path, a detailed description of the strobe logic now follows with reference to FIGS. 12a–12f. FIG. 11 does not include a set of reset-window-strobe signals while FIGS. 12d and 12e do include these signals. This is because FIG. 11 is a simplified version of FIGS. 12a–12f.

Figure 12B:
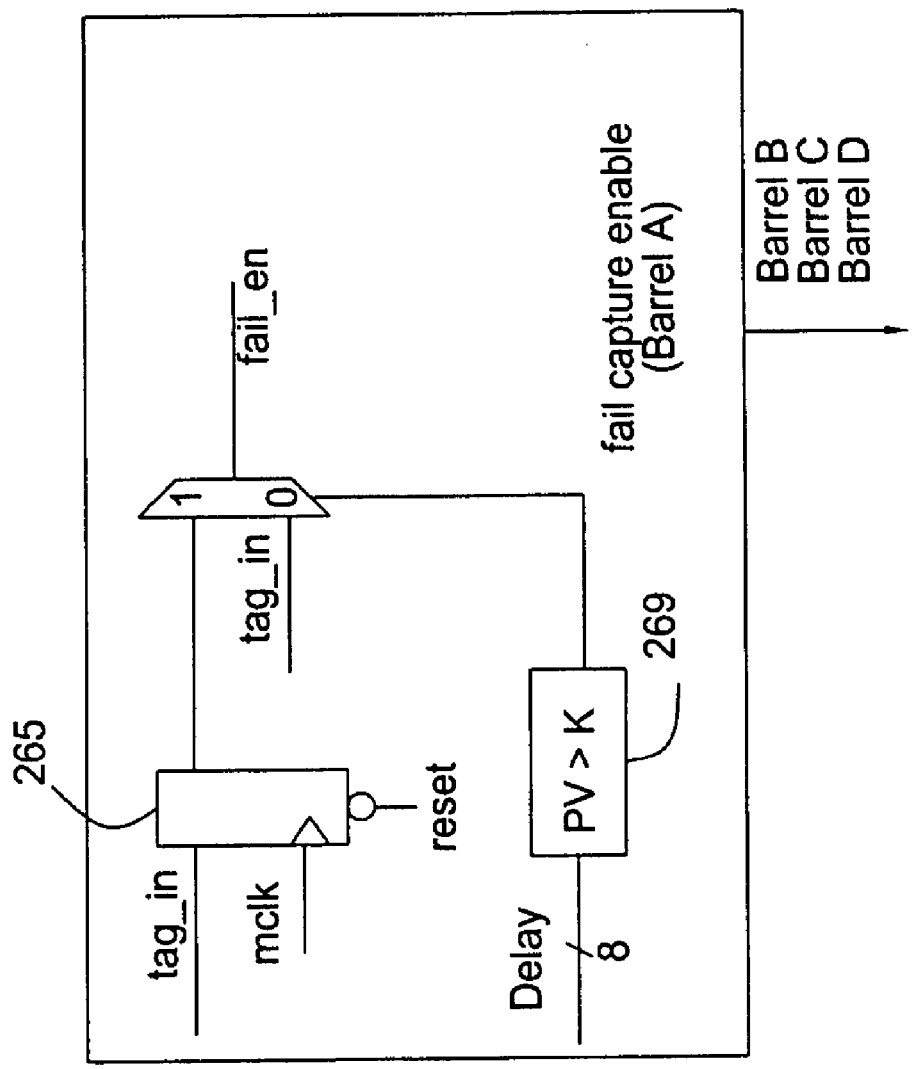
Figure 12C:
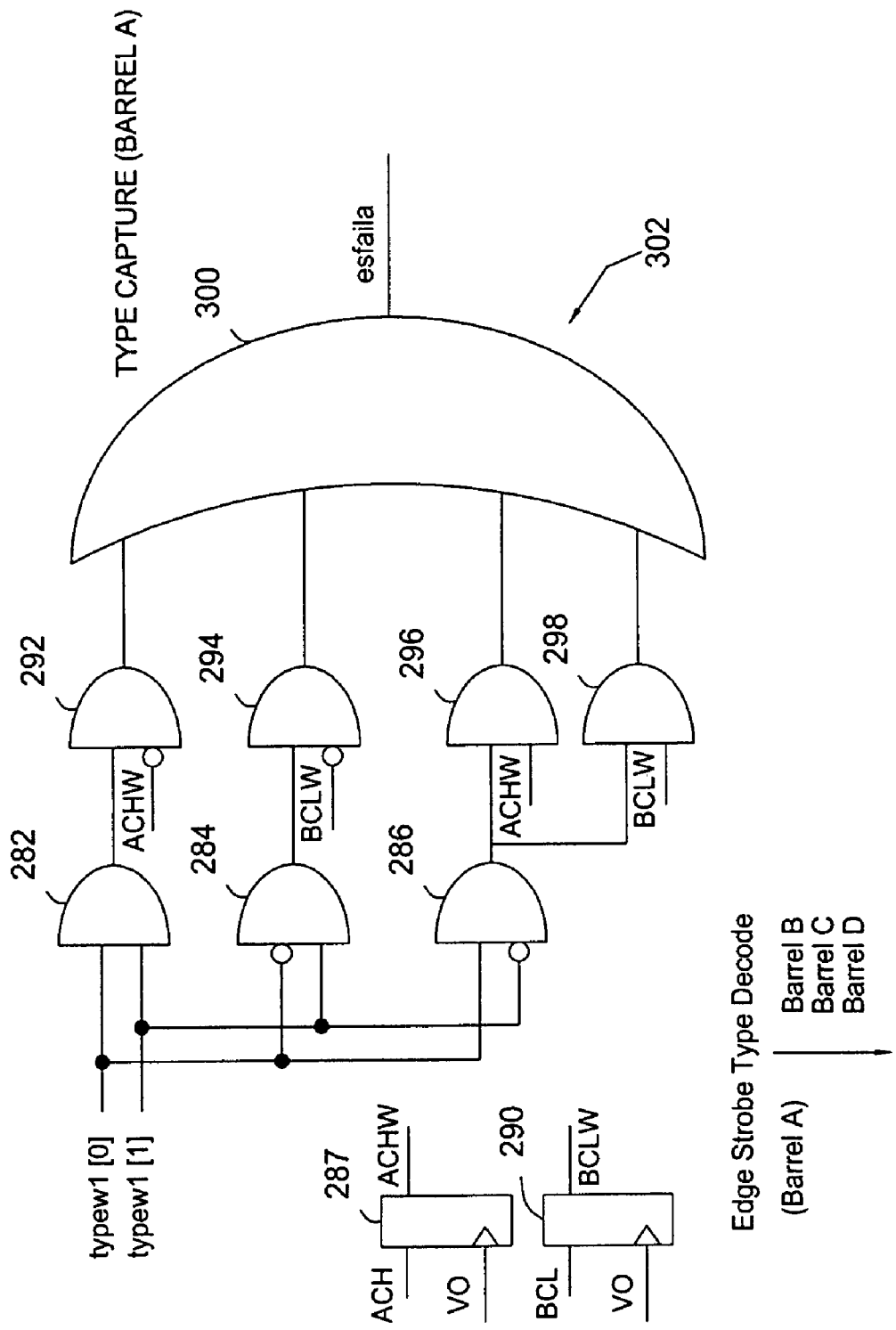
Figure 12D:
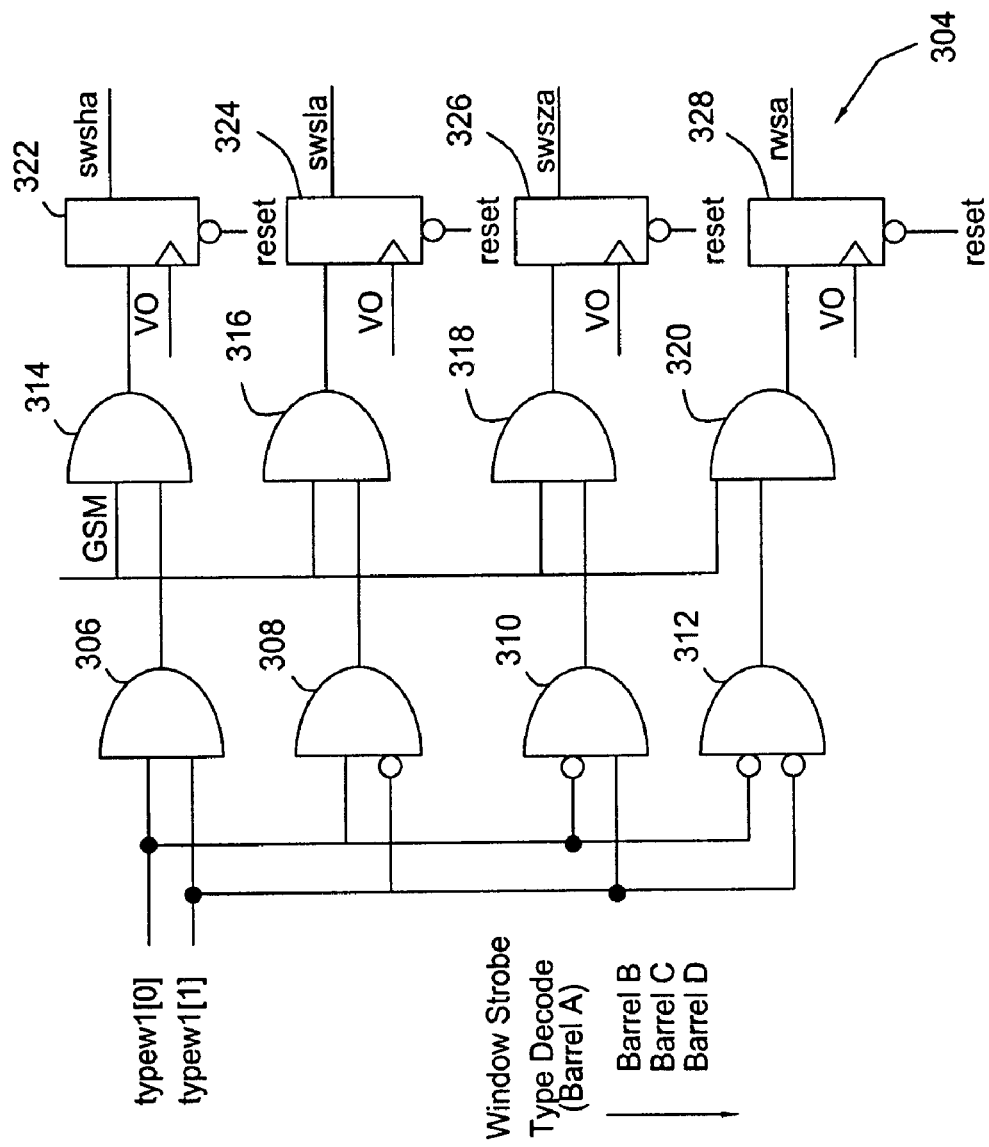
Figure 12F:
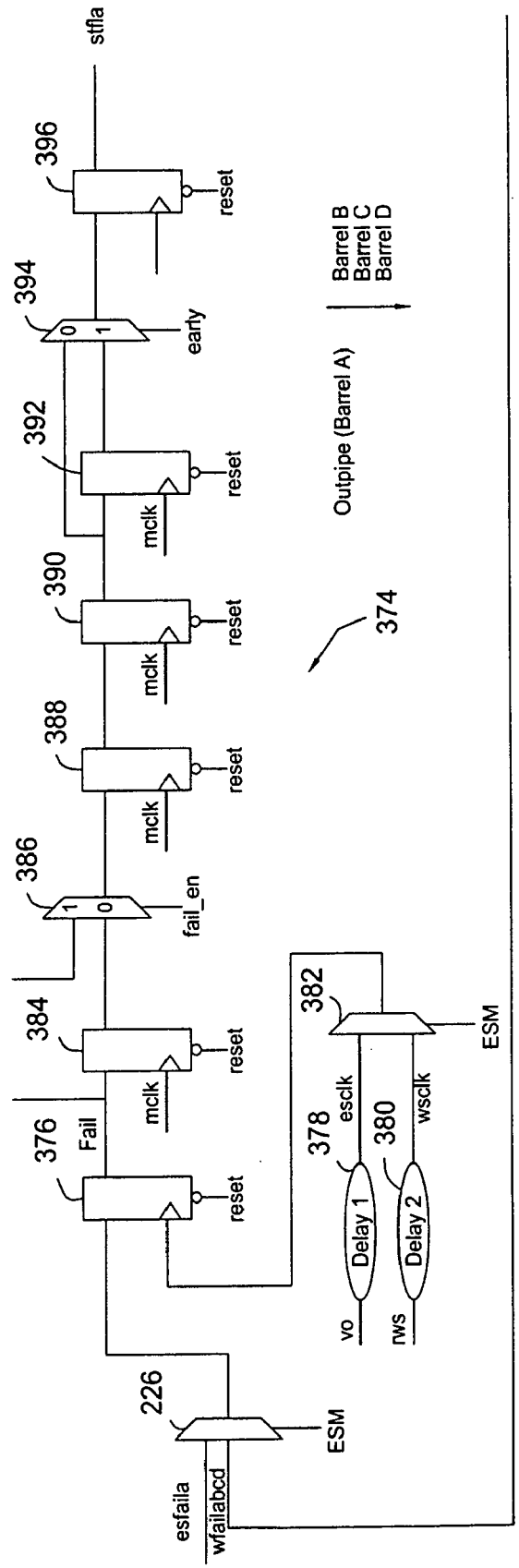

In one embodiment, one slice of the strobe logic includes a plurality of type capture circuits (FIG. 12a), a plurality of edge strobe type decoders (FIG. 12c), a plurality of window strobe type decoders (FIG. 12d), a window strobe fail generator (FIG. 12e), and a plurality of outpipe circuits (FIG. 12f). In addition, the ELIF block includes a plurality of fail capture enable circuits (FIG. 12b) as is described further below. For example, for barrels A–D, one slice of the strobe logic could have four of each of the circuits shown in FIGS. 12a, b, c, d, and f.

With reference to FIG. 12a, a type capture circuit 234 ensures that type data does not get lost during an early event as the formatter has a specified time, e.g., only 2.5 nanoseconds, to catch type data. In one embodiment, type capture circuit 234 includes sub-circuits 272 and 274. Sub-circuit 272 includes a series of flip-flops 236, 238, 240, 242 that receive and pass type data from one flip-flop to another and are clocked by the master clock. The outputs of flip-flops 240 and 242 are tied to the inputs of a 2:1 MUX 244 controlled by the early bit described above with reference to FIG. 7. The output of the 2:1 MUX 244 is a signal termed typew.

Sub-circuit 274 includes a series of flip-flops 246, 248, 250 and 252 that receive and pass tag data from one flip-flop to another and are clocked by the master clock. The outputs of flip-flops 250 and 252 are tied to inputs of a 2:1 MUX 254 controlled by the early bit described with reference to FIG. 7. The output of MUX 254 is tagged to logic 276, which produces a VI signal (such as the VI signal shown in FIG. 7). In one embodiment, logic 276 is a simple transmission MUX constructed of a NMOS and PMOS transistor. The "tag_in" input and its inversion (2.5 ns wide pulses) are tied to ports "pulen" and "pulenn", respectively. The 2.5 ns master clk (mclk) is tied to the port "clkin". Whenever "pulen" and "clkin" are in phase, the output "out" produces a 2.5 ns wide pulse, called VI.

The VI signal is the clock of a flip-flop 256 that has an output the complement of which is tied to its data input. The output of the flip-flop 256 is tied to the input of a 2-input AND gate 258. The complement of the output of the flip-flop 256 is tied to the input of a 2-input AND gate 260. The other inputs of AND gates 258 and 260 receive typew data from sub-circuit 272. The outputs of AND gates 258, 260 provide the inputs to flip-flops 262 and 264 (clocked by the master clock), respectively, which in turn provide the inputs to a 2:1 MUX 266.

Similarly, the VI signal is passed through DLE 280 to logic 278, which outputs a VO signal (such as the VO signal shown in FIG. 7). Logic 278 is a conventional glitch generator which narrows the pulse width of "VO" from approx 2.0 ns to 0.8 ns. The complement of the VO signal clocks a flip-flop 270 that has an output the complement of which is tied to its data input. The output of flip-flop 270 is also the control input of the 2:1 MUX 266. The output of the 2:1 MUX 266 is the input of flip-flop 268 clocked by the VO signal. The output of the flip-flop 268 is labeled typew1.

Thus, the type capture circuit 234 includes a ping-pong circuit. The goal of the ping-pong circuit is to have two paths with only one path active at a time. The VI signal operates as a clock for flip-flop 256 and the VO signal operates as a clock for flip-flop 270, which acts as control for MUX 266.

The type-capture circuit locks in type information because the response circuit should sample associated type data before the associated type data goes away. With reference to FIG. 7, the timing of the VO signal is a function of two things: (1) the program delay, e.g., 30 ps, and (2) the inherent propagation delay of the delay line itself. If the inherent propagation delay of the line exceeds 2.5 nanoseconds the CVO signal automatically goes onto the next cycle, i.e., the CVO can actually come three or more nanoseconds after the associated CVI signal has occurred, which means that the type that belongs to the CVO has already disappeared. The CVI and associated type data are synchronous. Thus, the type-capture circuit functions to lock in the appropriate type and make sure that the CVO that is generated captures the appropriate type data. In other words, one can characterize the type-capture circuit as a first-in first-out (FIFO) circuit.

With reference to FIG. 12b, a fail enable circuit includes a flip-flop 265, a 2:1 MUX 267 and a circuit 269 for determining if the delay in reaching the ELIF has exceeded a specified value. The circuit 269 is a conventional circuit. Based upon the programmed delay value of an event exceeding a pre-specified threshold, circuit 269 delays the tag bit propagation by a clock cycle so that the STFL can be synched to the corresponding "CVI" trigger. Such a circuit is familiar to one of ordinary skill in the art. The flip-flop 265 receives tag-in data and is clocked by the master clock. The 2:1 MUX 267 receives tag-in and the output of the flip-flop 265 as inputs. The circuit 269 receives eight bits of delay data and provides a control signal to the 2:1 MUX 267, which in turn provides a fail-enable signal. This circuit provides the fail enable signal to an outpipe (shown in FIG. 12f) to help ensure that the formatter passes out the correct fail signals regardless of whether a relevant process is slow or fast. A process can be slow, typical or fast. For example, if one wants to realize an ideal delay of 1 nanosecond and one designs a circuit to provide such a delay, once the circuit is actually fabricated in silicon, the delay provided by the circuit may be longer than, substantially equally to, or shorter than 1 nanosecond. Embodiments of the invention use a fail capture enable circuit to provide a fail enable signal to the outpipe (described below) to take into account the fact that a process can be slow, typical or fast.

With reference to FIG. 12c, an edge strobe type decode circuit 302 includes: Flip-flops 288, 290; two-input AND gates 282, 284, 286, 292, 294, 296, 298; and a four-input OR gate 300. The first and second flip-flops 288, 290 are clocked by VO and have ACH and BCL as inputs and ACHw and BCLw as outputs, respectively. AND gate 282 has the first and second bits of typew1 as inputs. AND gate 284 has the second bit of typew1 and the complement of the first bit of typew1 as inputs. AND gate 286 has the first bit of typew1 and the complement of the second bit of typew1 as inputs.

AND gate 292 has the output of AND gate 282 and ACHw as inputs. AND gate 294 has the output of AND gate 284 and BCLw as inputs. AND gate 296 has the output of AND gate 286 and ACHw as inputs. AND gate 298 has the output of AND gate 286 and BCLw as inputs. The OR gate 300 has the output of AND gate 292, the output of AND gate 294, the output of AND gate 296, and the output of AND gate 298 as inputs. The edge strobe type decode circuit 302 operates to strobe the ACH and BCL signals at a time indicated by the VO signal and in a manner indicated by the typew data.

With reference to FIG. 12d, the window strobe type decoder 304 includes two-input AND gates 306, 308, 310, 312, 314, 316, 318, 320 and flip-flops 322, 324, 326, 328. The flip-flops are all clocked by VO. Two-input AND gates 306, 308, 310 and 312 receive the first bit of typew1, the second bit of typew1, the first bit of typew1, the complement of the second bit of typew1, the complement of the first bit of typew1, the second bit of typew1, the complement of the first bit of typew1, and the complement of the second bit of typew1, respectively, as inputs. Two-input AND gates 314, 316, 318, and 320 each receive an edge strobe mode (ESM) control bit as an input. They also receive the output of AND gates 306, 308, 310, and 312, respectively as inputs. Similarly, flip-flops 322, 324, 326, and 328 receive the outputs of AND gates 314, 316, 318, and 320 as data inputs and in turn output signals window strobe high (swsha), window strobe low (swsla), window strobe z (swsza), and reset window strobe (rwsa).

The illustrated embodiment includes four window strobe type decoders 304 per slice. With reference to FIG. 12e, the outputs of the decoders 304 are inputs to a window strobe fail generator 330. The generator includes: five four-input OR gates 332, 334, 336, 338, 372; eleven flip-flops 340, 342, 344, 356, 358, 360, 362, 364, 366, 368, 370; a delay 346; and two-input AND gates 348, 350, 352, 354. The four-input OR gates 332, 334, 336, 338 receive signals swsh*, swsl*, swsz*, and rws* where *=A, B, C, and D, respectively.

Flip-flops 340, 342, 344 are clocked by the output of OR gates 332, 334, 336, respectively and each have a high signal as a data input. Delay 346 receives the output of OR gate 338 and outputs rws4-dl. Delay element 346 is a combination of buffers that matches the delay between competing paths as will be known by those of ordinary skill in the art. It's a conventional circuit, consisting of two to three standard buffers. It approximates the delay of stages 342+350, 344+ 352/351, and 342+348. Two-input AND gate 348 receives the output of flip-flop 340 and the complement of ACH as inputs. Two-input AND gate 350 receives the output of flip-flop 342 and the complement of BCL as inputs. Two-input AND gate 352 receives the output of flip-flop 344 and ACH as inputs. Two-input AND gate 354 receives the output of flip-flop 344 and BCL as inputs. Flip-flops 356, 358, 360, 362 are clocked by AND gates 348, 350, 352, 354, respectively, and have a fixed high value as data inputs. Flip-flops 364, 366, 368, 370 receive the outputs of flip-flops 356, 358, 360, 362, respectively, as data inputs and are clocked by the output of OR gate 338. Flip-flops 340,342, and 344 are reset by the output of OR gate 338. Similarly, flip-flops 356–362 are reset by rsw4_dl, the output of delay 346. Finally OR gate 372 receives the outputs of flip-flops 356, 358, 360, 362 as inputs and outputs a window strobe fail signal (wfailabcd). The window strobe fail generator supplies the same signal, i.e., wfailabcd, to the outpipe for each barrel—that is for barrels A–D. This is not redundant because in window strobe mode the fail is reported on the barrel which receives the X (strobe-off) event. X event can occur on any one of the (A,B,C,D) barrels.

With reference to FIG. 12f, an outpipe circuit 374 includes: 2:1 MUXs 226, 382, 386, 394; delays 378, 380; and flip-flops 376, 384, 388, 390, 392, 396. A 2:1 MUX 226 receives the output of edge strobe type decoder 302 and the output of the window strobe fail generator 330 as inputs and ESM as a control signal. Flip-flop 376 receives the output of MUX 226 as data input. Delays 378, 380 receive VO and reset window strobe (rws), respectively, as inputs. Delay elements 378, 380 are conventional constructed out of buffers. Element 380 matches the delay of signal wfailabcd plus the delay provided by element 226. Element 378 matches the delay of signal esfail(a/b/cd) plus the delay provided by element 226. 2:1 MUX 382 receive the outputs of the delays as inputs and ESM as a control input. Flip-flop 376 receives the output of MUX 382 as a clock. Flip-flop 384 receives the output of flip-flop 376 as data input and the master clock as a clock signal. A 2:1 MUX 386 receives the output of flip-flops 376 and 384 as inputs and the output of the fail capture enable (FIG. 12b) as a control input. Flip-flop 388 receives the output of 2:1 MUX 386 as input and master clock as clock input. Flip-flop 390 receives the output of flip-flop 388 as input and master clock as clock input. Flip-flop 392 receives the output of flip-flop 390 as input and master clock as clock input. 2:1 MUX 394 receive the outputs of flip-flops 390 and 392 as inputs and the early state bit (shown in FIG. 7) as a control signal. The circuit used to detect an early state and produce the early state bit is conventional. Finally, flip-flop 396 receives the output of MUX 394 as input and master clock as clock input and outputs a strobe fail signal. (stfl* where *=A, B, C, D).

In one embodiment, the receive/strobe circuit includes a plurality of, e.g., eight, slices. Thus, in one embodiment, the response circuit is capable of comparing outputs (ACH/ BCL) from up to eight independent DUT channels, in both edge and window strobe modes. Moreover, any combination of pins can be strobed in either window strobe or edge strobe mode. In edge strobe mode, for a given DUT pin, the leading edge of the DLE output pulse, CV0X (X=A, B, C, D) decides pass or fail. Fails are associated with the DLE channel, which caused the strobe. In window strobe mode, however, the DLE channel receiving the strobe-off event reports a pass or fail, which occurred, on any one of the other three DLEs prior in time. The strobe events can occur simultaneously on all four DLEs during edge strobe mode. In one embodiment, the minimum time separation between a "Strobe-On" (Strobe-Hi, Strobe-Lo or Strobe-Z) event and a "Strobe-Off" event is greater than or equal to 800 ps in window strobe mode. Additionally, in one embodiment, the response circuit can compare pulses as narrow as 800 ps on ACH/BCL lines for an expected pass or a fail in window strobe mode.

The four fail outputs, one per DLE, are called STFL* (*=A, B, C, D). The error correlator circuit 202 correlates these run-time fail signals with the events in the timing generator circuit, so that a user can obtain comprehensive event-by-event pass/fail information about the test.

TMUMUX Section

With reference to FIG. 13, in one embodiment the response circuit also includes a high speed timing measurement unit multiplexer (TMUMUX) section for providing high speed system diagnostics. FIG. 13 shows a response portion of the global TMUMUX 194(shown in FIG. 8). The response portion 228 contains two high-speed TMUMUXs, TMUMUXCA and TMUMUXCB (not shown but similar to TMUMUXCA other than having the CVO signals in place of the CVI input signals to the first set of multiplexers and B versions of all the control signals and outputs).

In one embodiment, TMUMUXCA includes 24 4:1 MUXs coupled to 6 4:1 MUXs coupled to 3 2:1 MUXs coupled to a single 4:1 MUX 227. The 24 4:1 MUXs receive as input: 1) the signals CVI*A, CVI*B, CVI*C and CVI*D, where *=0–7, i.e., the triggering inputs to the DLEs 126; 2) the signals FAIL*A, FAIL*B, FAIL*C, and FAIL*D, where *=0–7, i.e., the outputs of the outpipes shown in FIG. 12f; the signals ACHB* where *=K–R and W–Z; and signals BCLB* where *=K–R and W–Z. The output of the single 4:1 MUX 227 and the complement of that output are the two inputs for a 2:1 MUX 229. The output of the 2:1 MUX 229 is one input to another 4:1 MUX 231 and to the clock input of a toggle flip-flop 230. The 2:1 MUX 229 for TMUMUXCA (TMUMUXCB) has a control signal INVA (INVB). The flip-flop's output is tied to a second input of the 4:1 MUX 231 and the complement of the flip-flop's output is tied to the flip-flop's data input. The flip-flop 230 has a reset signal, TOGLRA. Finally, a signal TMUPAIN is tied to the other two inputs of the 4:1 MUX 231. The 4:1 MUX 231 has two control inputs, TOGLRA and RICSELA.

Control signals, e.g., HSPA* where *=1–6, TOGLRA and RICSELA and the section B equivalents, determine which signals are routed through the TMUMUXCA and TMUMUXCB (not shown). More specifically, HSPA 5 and 6 control the group of 24 4:1 MUXs, HSPA 3 and 4 control the group of 6 4:1 MUXs, HSPA 2 controls the group of 3 2:1 MUXs, and HSPA 0 and 1 control the 4:1 MUX 227, and TOGLRA and DICSSELA control the 4:1 MUX 231. More generally, one embodiment of a test system according to the invention controls MUXs in the response portion of the global TMUMUX to select which of the many internal timing signals (generated by the ELIF block, the associated DLEs and the response logic and/or the pin electronics) the TMUMUX should route, through outputs TMUCA and TMUCB, to a system timing measuring unit (TMU) for calibration and/or diagnostic purposes.

One embodiment of the TMUMUX operates as follows. The response circuit routes two input signals TMUPAIN and TMUPBIN to TMUMUXCA 228 and TMUMUXCB (not shown), respectively, to measure their marker locations with a high degree of accuracy and resolution. As noted above, signals CVI*A, CVI*B, CVI*C and CVI*D, where *=0–7 are the triggering inputs to their respective DLEs 126, while signals CVO*A, CVO*B, CVO*C, and CVO*D, where *=0–7, are the strobe marker outputs from their respective DLEs 126. In one embodiment, the response circuit routes these signals as well as the Fail and ACH/BCL signals to a 2:1 MUX 229 and an associated 2:1 MUX in TMUMUXCB.

Each toggle flip-flop, i.e., flip-flop 230 and an associated flip-flop in TMUMUXCB, has a clock input coupled to the output of the associated 2:1 MUX. As a result, the toggle flipflops select either very short pulses or generate signals whose edges are timed by very short pulses. The drive circuit routes the pulses through the multiplexers in such a way that the toggling of the flipflops, i.e., flip-flop 230 and an associated flip-flop in TMUMUXCB, can take place on either the signals' leading or trailing edges. More specifically, if the same pulse is passed to the 2:1 MUX 229 in TMUMUXCA and the associated 2:1 MUX in TMUMUXCB and if signal INVA on 2:1 MUX 229 is the complement of signal INVB on the associated 2:1 MUX in TMUMUXCB, then the flip-flops of TMUMUXCA and TMUMUXCB will trigger on the rising and falling edge, respectively, of the pulse being measured. The TMUMUX section transmits the resulting TMUCA and TMUCB signals to a TMU to measure the distance between the TMUCA and TMUCB signals and, as a result, to measure the width of the pulse in question.

In one embodiment, the layout designer matches on-chip propagation delays for all internal DLE markers (CVO*), which the drive circuit routes through TMUMUXCB, and their triggers (CVI*) which the response circuit routes through TMUMUXCA, to preserve accuracy and assure proper marker alignment under various PVT (Process Voltage Temperature) conditions.

Thus, the response circuit has two TMU MUXs, TMUMUXCA and TMUMUXCB. The two MUXs have similar architecture to each other and to the TMUMUXA (FIG. 9) of the drive circuit. In addition to providing observability for internal timing critical signals, the response circuit can also select the MUXs to pipe out run-time event failures for diagnostic purposes.

In "loop-back" mode, the formatter can internally loopback DHI/DINH signals generated by the complimentary drive circuit onto the strobe-side, for a first-level, self-diagnostic validation of the drive and response-side functionality. With reference to FIG. 6, the formatter can buffer DHI/DINH signals in buffers 158, 162, respectively. 2:1 MUXs 160, 164 controlled by a LPBK signal can select between ACH/BCL and DHI/DINH, i.e., between normal mode and loop-back self test mode for testing for DHI/DINH jitter. In an embodiment of the invention having "loop-back" the outputs of the 2:1 MUXs 160 and 164 of FIG. 6 interface with the other figures everywhere the ACH and BCL signals were indicated. Another embodiment that includes a plurality of MUXs 233 for implementing the loop-back self test are shown in FIG. 13. These MUXs receive the output of ACH/BCL and DHI/DINH as well as other signals, TMUDA/TMUDB and TMUPAIN/TMUBPIN. FIG. 6 is a simplified version of 233.

Readback data bits 0 & 1 in the upper right hand corner of FIG. 13 allow the user to determine the state of ACH/BCL signals prior to and after running a test.

Auto-calibration

With reference to FIG. 14a, in one embodiment an auto-calibration circuit 398 includes: two-input AND gates 400, 410, 416, 418; three-input AND gate 404; four-input AND gates 412 and 414; two-input OR gates 402 and 406; 2:1 MUXs 434 and 420; 4:1 MUX 422; glitch generator 408; regenerator circuit 232; event counter 426 with event counter register 428; gate counter 430 with gate counter register 432; and an auto-address generation circuit 436 (shown in FIG. 14b). In one embodiment the formatter establishes programmable delays by connecting a plurality of, e.g., eight, DLEs 126 in a loop, for a plurality of loops (e.g., a total of eight loops) per formatter (64 DLEs). Asserting the ring oscillator bit (RINGO) inside a local register and receiving a start oscillation event triggers the loop.

More specifically, AND gate 400 receives a ring oscillator signal and a start oscillation signal. OR gate 402 receives as inputs the output of AND gate 400 and a gate counter overflow (GCO) value (described below). AND gate 404 receives as input the output of OR gate 402 along with a first control signal, CC1, and the complement of a second control signal, CC0. OR gate 406 receives as input the output of AND gate 404. Glitch generator 408 receives as input the output of OR gate 406. Regenerator circuit 232 receives as input the output of glitch generator 408 and regenerates (as described further below with reference to FIG. 14c) the pulse traveling in the loop 411. The loop 411 includes a string of connected DLEs 126. Each DLE receives the pulse and passes it on to the next DLE until the pulse reaches the last DLE. AND gate 410 receives as input the output of the last DLE. The loop 411 is completed when OR gate receives as its second input the output of AND gate 410.

AND gate 418 receives the output of AND gate 410 and the ring oscillator signal as inputs. 4:1 MUX 422 receives the output of AND gate 418 as an input. The gate counter 436 receives the output of the 4:1 MUX 422 as input. The gate counter starts counting the number of times the loop 411 is traversed by a pulse once the ring oscillator signal goes high until the count reaches a specified value, the gate counter overflow (GCO) value. At which point the gate counter outputs a GCO signal.

The auto-calibration circuit distributes the complement of the GCO signal to a number of the elements described above. AND gates 410, 412, 414, and 416 receive the complement of the GCO signal as inputs. AND gate 414 also receives a clock signal, e.g., a 400 MHz clock signal, the start oscillation signal, and the ring oscillator signal as inputs. 2:1 MUX 420 receives the output of AND gate 414 as input. Event counter 426 receives the output of AND gate 414 and counts the number of clocks from the beginning of assertion of the start oscillation and ring oscillator pulses until the GCO signal goes low.

As the pulse travels around loop 411, the pulse loses energy to the point where the auto-calibration circuit can malfunction. Thus, typically the auto-calibration circuit needs to regenerate the pulse. However, a conventional regeneration circuit does not regenerate the pulse with an accurate timing edge. Thus, with reference to FIG. 14c, in one embodiment of the invention, the regeneration circuit 232 includes a flip flop 458 clocked by the output of the glitch generator 408 and having a data input tied to a high level. The first DLE 126 in the loop 411 receives the output of the flip-flop 458. The DLE 126 has two outputs; one output is tied to the set input of flip-flop 458 and the other output is tied to the next DLE 126 in the loop 411. Thus, the regenerator circuit 232 accurately regenerates a pulse each time the pulse enters the regeneration circuit.

Returning to FIG. 14a, in one embodiment the auto-calibration circuit 398 can also calibrate an external formatter. Counter configuration data CC1 and CC0 control the auto-calibration circuit to switch from calibrating the internal formatter to calibrating an external formatter. In this embodiment, AND gate 412 receives as input: an external input, the CC0 signal, and the complement of the CC1 signal. 2:1 MUX 420 receives as input the output of AND gate 412. The 2:1 MUX is controlled by the CC0 signal. Similarly AND gate 416 receives the external output and the GCO signal as inputs and 4:1 MUX 422 receives as data inputs: the output of AND Gate 416, the output of AND gate 418, a low or 0 signal, and a clock signal, e.g., a 400 MHz signal. The 4:1 MUX 422 also receives the CC1 and CC0 signals as control inputs.

One embodiment of the auto-address generation circuit, shown in FIG. 14b, includes an OR gate 438 receiving RINGO and GCO signals as inputs and coupled to an 8 bit auto-address generator 444. The auto-address generator is built out of conventional elements, i.e., counters and flops. It generates discrete addresses for setting up the delay line prior to being calibrated for each value of the delay. Similarly, the 8 bit overflow detect, the 4-bit TDLE counter and the Decoder are also built out of conventional elements in a fashion familiar to one of ordinary skill in the art. The auto-address generator 444 also has TDLEINIT 440 and TDLE OFFSET 442 as inputs. The auto-address generator outputs 8 bits, A0–A7 to an 8 bit overflow detect component 446. The output of the overflow detect 446 and the complement of an output of the auto address generator 444 form the two inputs of a 2:1 MUX. The complement of the output of the MUX couples to the reset of the auto-address generator 444 and to the input of a 4-bit TDLE counter 450. The TDLE counter provides 4 inputs to a decoder 452 that has outputs L0–L8. The L7 and L8 outputs form the 2 inputs to a 2:1 MUX 454. The output of the MUX 454 resets the TDLE counter. Finally the L0–L7 and the A0–A7 form the two inputs to eight 2-input AND gates 456, respectively. The outputs of the eight AND gates 456 form one of the inputs to the eight 2:1 MUXs 434 of the counter circuit 398.

Having described the physical layout of one embodiment of the auto-calibration circuit, a description of the operation of the auto-calibration circuit now follows. The auto-calibration circuit connects the ring oscillator output to an on-chip gate/event counter circuit for highly accurate time measurements. Actual DLE delay ranges from about 0.9 ns to about 1.4 ns under program conditions. So the loop delay ranges from about 7.2 ns to about 9.7 ns (assuming all DLEs except the one being calibrated are set to their fastest position). The programmable width of the gate counter determines the resolution of the time measurement. The auto-calibration circuit uses registers GATECOUNT 432 and EVENTCOUNT 428 to set the counters to a predefined count value, prior to commencing calibration. Upon reaching the desired gate count, the event counter shuts off and the auto-calibration circuit offloads the time count values into offchip capture memory 500. For diagnostic purposes, reading back the contents of registers GATECOUNT 432 and EVENTCOUNT 428, obtains current gate and event count.

In calibration mode, a state machine generates bit settings for the delay line elements by adding the contents of the register DLEOFFSET 442 to that of DLEINIT 440. Both of these registers are loaded during chip setup, prior to calibration. For each of the DLEs, the state machine advances the bit settings by the offset amount till the auto-calibration circuit achieves the last bit combination. The auto-calibration circuit repeats this process sequentially for all of the delay lines inside the loop. In case of the formatter, once software linearizes the "raw" event-count time values, the delay codes corresponding to the 256 out of 1024 linearized time values (spanning 0–2.5 ns) are transferred back into the relinearization tables via CPU bus using block writes.

To estimate how long it would take to acquire data for calibration, assume that each DLE has a total of 10 selection bits and produces binary delays for each of the bit settings. If the minimum and maximum propagation delays are 0.9 ns and 1.4 ns (obtained via a SPICE simulation over all relevant PVT conditions), respectively, then the resolution of the delay line is approximately given by r=0.4883 ps/bit. SPICE is a program for modeling the operation of a trial circuit. In one embodiment, each DLE except the one that is being calibrated, is set to its minimum delay setting (900 ps). Then, the time required to acquire the delays for all 1024 ($2^{10}$) values using 14 bit gate counter is give by, $$T_{acquire} = \sum_{k=0}^{k=2^{10}-1} 2^{14}(7 \cdot (900) + (900 + 0.4883 \text{ k})) \text{ ps} = 0.097 \text{ s}$$

Since in the illustrated embodiment, there are 8 DLEs in a loop, the total time required for acquiring data is simply 8×0.097 s=0.776 s. Furthermore, since there are eight such independent loops per formatter, it will still take 0.776 s to acquire data for all of the DLEs when calibrated in parallel.

Indeed, it would take exactly 0.776 s to acquire DLE data for the entire system, when all timing generation ICs in the system are calibrated in parallel. This scheme improves the overall calibration data acquisition time by a factor of 500. It is important to note that this estimate for acquisition time doesn't take into account data transfer off chip, or transfer of relinearized data from CPU to the relinearized tables. Also, with a 14-bit gate counter, a resolution of 0.61 ps/count (or, equivalently, 1.64 counts/ps) can be achieved.

In one embodiment, software sorts and linearizes the delay time counts (stored in the capture memory) between 0 and 2.5 ns. Prior to run-time operation, for each of the DLEs, the linearized delay values along with their corresponding bit settings are uploaded onto look-up tables inside the timing generation IC. During runtime operation, user generated delay values (with a resolution of 20 ps) are compared with the entries in the look-up tables to pick out the delay line bit settings, which would most closely yield the programmed delay value.

Generalized Use of Gate and Frequency Counters

Apart from measuring the loop delay during the calibration of DLEs, the gate/frequency counter arrangement can also be used to provide either a frequency or time count for an arbitrary input signal. In diagnostic/calibration mode, counter configuration register CNTRCONFIG, via control signals CC0 and CC1, selects either the external signal or the ring oscillator output for measurement purposes. The table in FIG. 14a shows the usage of the gate/event counter for various bit settings of the counter configuration register. For a formatter with 8 independent ACH/BCL input pairs (which can be alternatively used as pads for accepting signals from external sources during calibration), up to 8 independent external signals can be routed to each of the eight gate/frequency counter circuits (4 for drive side and 4 for compare side) inside the formatter. Depending upon counter configuration bit settings, either a frequency or a time count value can be transferred to the off-chip capture memory or stored in register EVENTCOUNT 428 for read back.

In one embodiment, the bit settings for a counter configuration are the following:

| CC1 | CC0 | Action |
| --- | --- | --- |
| 0 | 0 | Time count for external input |
| 1 | 1 | None |
| 1 | 0 | Time count for ring oscillator |
| 0 | 1 | Frequency count for external input |

General Considerations

Certain techniques facilitate achieving specified test system performance, e.g., a specified edge placement resolution and accuracy for a specified number of transitions per second, in CMOS. Temperature and voltage variation are factors in reduction of edge placement accuracy (EPA) in CMOS. For example, in one embodiment, a timing generation IC uses independent band-gap references for every 2–4 channels to ensure on-chip voltage variation of less than about 4% and preferably less than 2%. If the voltage variation in a CMOS cell is greater than 5%, the EPA is reduced by 2–3 times for a specified number of transitions per second and for a specified edge placement resolution. A cell is an area of an integrated circuit that has a specified structure for performing a specified function. CMOS cells have a strong dependence on drain to source voltage (VDS). If VDS fluctuates by a certain percentage, it impacts the drain to source current flow, which changes the timing of the charge/discharge of the associated capacitances and in effect controls the occurrence of an edge, e.g., a rising edge. There are voltage variations other than VDS variation that impact the EPA such as: Substrate noise which affects ground voltage, VSS; Capacitive cross-coupling of high speed signals which introduce unwanted voltage glitches causing slew-rate aberrations and variations in differential crossings for EPA critical signals.

Embodiments of the invention achieve temperature compensation/control to effect desired performance. The liquid cooling in one embodiment of a Test System PCB maintains the case temperature of the IC at +/−2 degree Celsius, from a give set point temperature. Furthermore, one embodiment uses a flip-chip package containing a heat spreader, with a net thermal resistance of 1.5 W/C between the die and the IC case. Secondly, on the die, part of the critical path such as the DLE's, are PVT (Process, Voltage, Temperature) compensated. For the portion of the critical path which is not PVT compensated, one embodiment of the invention uses a judicious combination of standard cells of various drive strengths, such that the overall propagation delay (Tpd) variation of the path due to temperature fluxes is minimized. In addition to voltage and temperature compensation/control, embodiments of the invention use a number of other techniques to achieve a specified number of transitions per second with a specified edge placement accuracy and resolution—More specifically, embodiments of the invention utilize cross-talk prevention, deglitching of MUXes, path balancing (making sure that all the paths that drive up to custom logic are equivalent—physically the layout should be such that there are no path mismatches), prevention of set/reset pulses clobbering into each other at the capture latch, and careful shielding of each channel (each slice has 8 delay line elements and the delay line elements should be carefully shielded from each other using silicon and the routing should be such that there is minimized cross talk).

Given these examples, the present invention applies temperature and voltage compensation to achieve a specified performance, that is a specified number of transitions per second (e.g., 800 MTPS) and a specified edge placement resolution and accuracy (e.g., 20 ps and +/−100 ps, respectively).

Figure 17A:
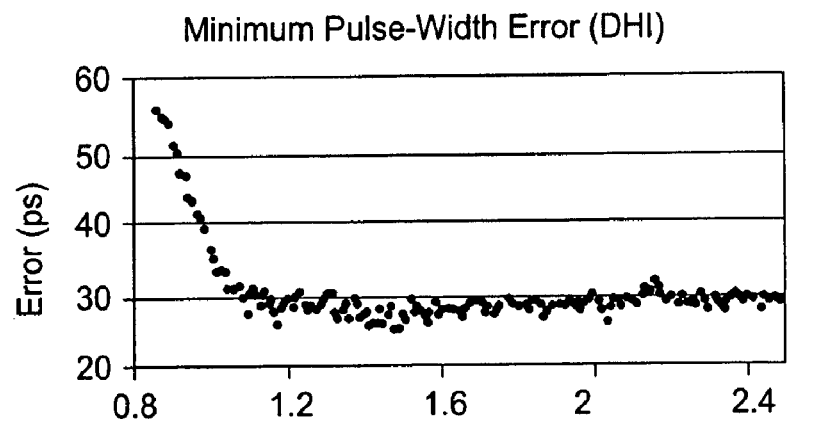

Turning now to FIGS. 17A–17C, FIGS. 17, A, 17B, and 17C illustrate SPICE simulations results obtained for the formatter of FIG. 1. FIG. 17A was obtained by running SPICE simulation on the drive portion of the circuit. A family of pulses on the DHI output was created by setting TYPE[1:0]=(1 1) at time=0 ns (phisel/cursel) followed by TYPE[1:0]=(1 0)=tns, where t was swept between 0.8 ns and 2.5 ns.

Figure 17B:
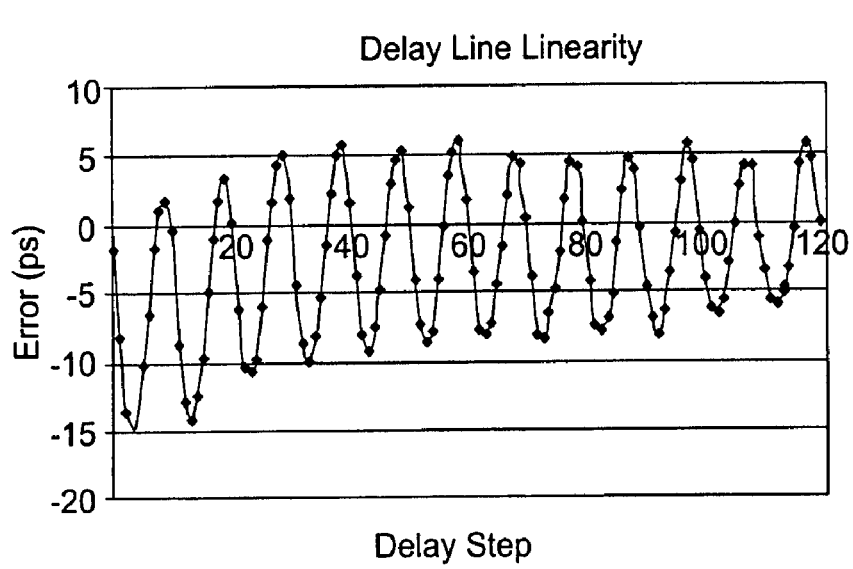

FIG. 17B was generated by programming delays between 0 ns and 2.5 ns in 121 steps on a TDLE, and measuring the location of the rising edge of "vo" pulses at the output of the TDLE.

Figure 17C:
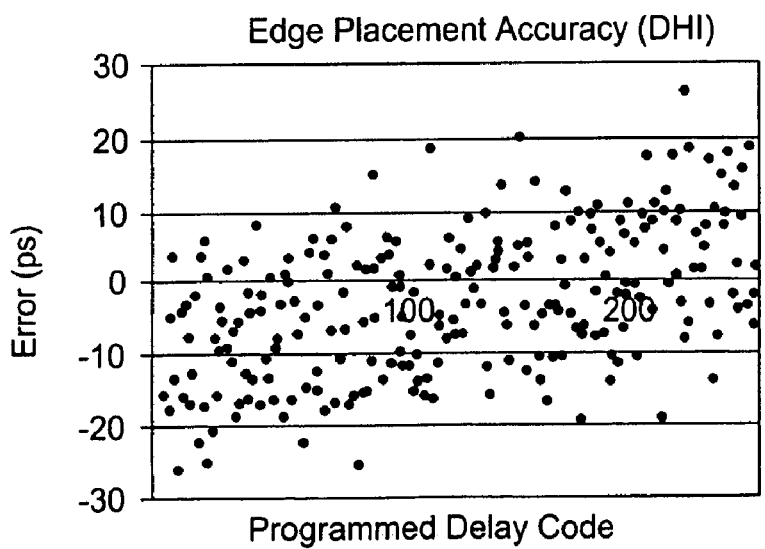

FIG. 17C has the same setup as FIG. 17B, except the location of DHI rising edge was measured. The process used in SPICE (HSPICE from Synopsys of Mountain View, Calif.) to generate FIGS. 17A–17C was "TYPICAL" at 60 C, with VDD=1.8V. In the context of ATE, the linearity, Edge Placement Accuracy (EPA), and monotocity of the delayed edges are three of the most important figures of merit for Formatter design.

Having thus described at least one illustrative embodiment of the invention, various alterations, modifications and improvements are contemplated by the invention. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A test system for providing formatted signals, the test system comprising:
    a timing generation circuit operative to provide timing information signals on a single CMOS Integrated Circuit (IC); and
    a formatter in communication with said timing generation circuit, said formatter comprising:
        a drive circuit, said drive circuit comprising:
            a plurality of event logic interfaces, each event logic interface capable of decoding signals received from said timing generation circuit;
            a plurality of delay line elements (DLEs), each DLE in communication with a corresponding event logic interface and capable of generating timing markers corresponding to signals received from an event logic interface; and
            a drive logic in communication with said plurality of DLEs and operative to produce formatted levels in response to timing markers received from said plurality of DLEs; and
    wherein variation of drain to source voltage of said plurality of DLEs are compensated such that the drain to source voltage variation below a specified percentage is maintained and such that said formatter provides a specified number of transitions per second and a specified edge placement resolution and accuracy.

2. The test system of claim 1 wherein said plurality of event logic interfaces use a lookup table to decode received signals.

3. A test system for providing formatted signals, the test system comprising:
    a timing generation circuit operative to provide timing information signals on a single CMOS Integrated Circuit (IC); and
    a formatter in communication with said timing generation circuit, said formatter comprising:
        a drive circuit, said drive circuit comprising:
            a plurality of event logic interfaces, each event logic interface capable of decoding signals received from said timing generation circuit;
            a plurality of delay line elements (DLEs), each DLE in communication with a corresponding event logic interface and capable of generating timing markers corresponding to signals received from an event logic interface; and
            a drive logic in communication with said plurality of DLEs and operative to produce formatted levels in response to timing markers received from said plurality of DLEs; and
    wherein temperature variation of said plurality of DLEs are compensated such that the temperature variation below a specified percentage is maintained and such that the formatter provides a specified number of transitions per second and a specified edge placement resolution and accuracy.

4. The test system of claim 3 wherein compensating for temperature variation uses a liquid cooling system.

5. The test system of claim 3 wherein compensating for temperature variation uses a heat spreader.

6. The test system of claim 3 wherein said plurality of event logic interfaces use a lookup table to decode received signals.

7. A test system for providing formatted signals, the test system comprising:
    a timing generation circuit operative to provide timing information signals on a single CMOS Integrated Circuit (IC); and
    a formatter in communication with said timing generation circuit, said formatter comprising:
        a drive circuit, said drive circuit comprising:
            a plurality of event logic interfaces, each event logic interface capable of decoding signals received from said timing generation circuit;
            a plurality of delay line elements (DLEs), each DLE in communication with a corresponding event logic interface and capable of generating timing markers corresponding to signals received from an event logic interface; and
            a drive logic in communication with said plurality of DLEs and operative to produce formatted levels in response to timing markers received from said plurality of DLEs; and
    wherein voltage variation of said drive logic is compensated such that the voltage variation below a specified percentage is maintained and such that the formatter provides a specified number of transitions per second and a specified edge placement resolution and accuracy.

8. The test system of claim 7 wherein compensating for voltage variation comprises using bandgap references to compensate for voltage variation.

9. The test system of claim 7 wherein said plurality of event logic interfaces use a lookup table to decode received signals.

10. A test system for providing formatted signals, the test system comprising:
    a timing generation circuit operative to provide timing information signals on a single CMOS Integrated Circuit (IC); and
    a formatter in communication with said timing generation circuit, said formatter comprising:
        a drive circuit, said drive circuit comprising:
            a plurality of event logic interfaces, each event logic interface capable of decoding signals received from said timing generation circuit;
            a plurality of delay line elements (DLEs), each DLE in communication with a corresponding event logic interface and capable of generating timing markers corresponding to signals received from an event logic interface; and
            a drive logic in communication with said plurality of DLEs and operative to produce formatted levels in response to timing markers received from said plurality of DLEs; and
    wherein variation of drain to source voltage of said plurality of DLEs are compensated such that the drain to source voltage variation below a specified percentage is maintained;
    wherein temperature variation of said plurality of DLEs are compensated such that the temperature variation below a specified percentage is maintained; and
    wherein voltage variation of said drive logic is compensated such that the voltage variation below a specified percentage is maintained, such that the formatter provides a specified number of transitions per second and a specified edge placement resolution and accuracy.

11. The test system of claim 10 wherein said plurality of event logic interfaces use a lookup table to decode received signals.

12. The test system of claim 10 wherein compensating for voltage variation comprises using bandgap references to compensate for voltage variation.

13. The test system of claim 10 wherein compensating for temperature variation uses a liquid cooling system.

14. The test system of claim 10 wherein compensating for temperature variation uses a heat spreader.

* * * * *